(12) United States Patent
Sunaga et al.

(10) Patent No.: US 9,314,963 B2
(45) Date of Patent: Apr. 19, 2016

(54) IMPRINT PRODUCT AND METHOD FOR PRODUCING THE SAME

(71) Applicant: MITSUI CHEMICALS, INC., Minato-ku (JP)

(72) Inventors: Tadahiro Sunaga, Yamato (JP); Takashi Oda, Ichihara (JP); Hitoshi Onishi, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 67 days.

(21) Appl. No.: 14/035,149

(22) Filed: Sep. 24, 2013

(65) Prior Publication Data

US 2014/0021648 A1 Jan. 23, 2014

Related U.S. Application Data

(62) Division of application No. 13/201,973, filed as application No. PCT/JP2010/001271 on Feb. 25, 2010, now abandoned.

(30) Foreign Application Priority Data

Feb. 27, 2009 (JP) .................. 2009-046122

(51) Int. Cl.
*C08F 283/14* (2006.01)
*C08G 61/08* (2006.01)
(Continued)

(52) U.S. Cl.
CPC ............ *B29C 59/005* (2013.01); *B82Y 10/00* (2013.01); *B82Y 40/00* (2013.01); *C08G 61/08* (2013.01); *C08L 65/00* (2013.01); *G02B 3/0031* (2013.01);
(Continued)

(58) Field of Classification Search
USPC .......................... 526/252; 522/185; 264/226
See application file for complete search history.

(56) References Cited

U.S. PATENT DOCUMENTS 6,334,960 B1 1/2002 Willson et al.
6,482,742 B1 11/2002 Chou
(Continued)

FOREIGN PATENT DOCUMENTS

JP 2000-323461 A 11/2000
JP 2001-139776 A 5/2001
(Continued)

OTHER PUBLICATIONS

International Search Report (PCT/ISA/210) issued on Jun. 1, 2010, by Japanese Patent Office as the International Searching Authority for International Application No. PCT/JP2010/001271.

*Primary Examiner* — Peter D Mulcahy
*Assistant Examiner* — Henry Hu
(74) *Attorney, Agent, or Firm* — Buchanan, Ingersoll & Rooney PC

(57) ABSTRACT

Provided is an imprint product, which is for transcribing a fine pattern of a mold surface and which contains a fluorine-containing cyclic olefin polymer containing repeating unit represented by formula (1) and having a fluorine atom content rate of 40% to 75% by mass.

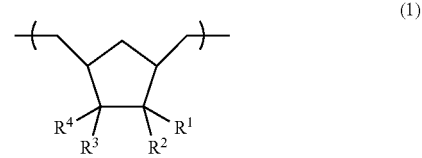

(1)

6 Claims, 1 Drawing Sheet

(51) Int. Cl.
  *B29C 59/00*   (2006.01)
  *B82Y 10/00*   (2011.01)
  *B82Y 40/00*   (2011.01)
  *C08L 65/00*   (2006.01)
  *G02B 3/00*    (2006.01)
  *G03F 7/00*    (2006.01)

(52) U.S. Cl.
  CPC ........ *G03F 7/0002* (2013.01); *C08G 2261/146* (2013.01); *C08G 2261/3324* (2013.01); *C08G 2261/418* (2013.01)

(56) References Cited

U.S. PATENT DOCUMENTS

| | | | |
|---|---|---|---|
| 6,719,915 | B2 | 4/2004 | Willson et al. |
| 6,875,819 | B2 * | 4/2005 | Sunaga et al. ............ 525/326.2 |
| 6,946,360 | B2 | 9/2005 | Chou |
| 2001/0040145 | A1 | 11/2001 | Willson et al. |
| 2002/0177319 | A1 | 11/2002 | Chou |
| 2003/0071016 | A1 | 4/2003 | Shih et al. |
| 2007/0095469 | A1 | 5/2007 | Burdinski |
| 2009/0215974 | A1 * | 8/2009 | Sunaga et al. ................ 526/282 |
| 2009/0246686 | A1 * | 10/2009 | Watanabe ............. C08F 283/01 430/270.1 |

FOREIGN PATENT DOCUMENTS

| | | | |
|---|---|---|---|
| JP | 2002-539604 A | | 11/2002 |
| JP | 2003-155365 A | | 5/2003 |
| JP | 2003-155385 | * | 5/2003 |
| JP | 2004-504718 A | | 2/2004 |
| JP | 2005-515617 A | | 5/2005 |
| JP | 2006-054300 | * | 2/2006 |
| JP | 2006-054300 A | | 2/2006 |
| JP | 2008-105414 A | | 5/2008 |
| JP | 2008-202022 | * | 9/2008 |
| JP | 2008-202022 A | | 9/2008 |
| WO | WO 02/07199 A1 | | 1/2002 |
| WO | WO 2005/049741 A1 | | 6/2005 |
| WO | WO 2009/093661 A1 | | 7/2009 |

* cited by examiner

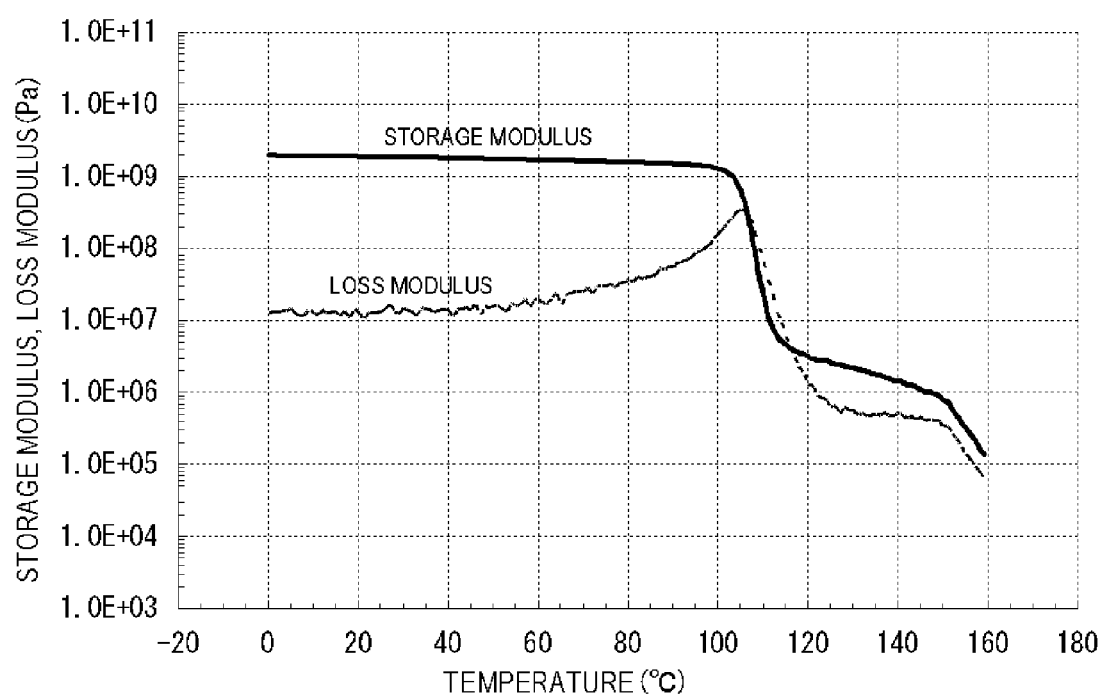

IMPRINT PRODUCT AND METHOD FOR PRODUCING THE SAME

The present application is a Divisional Application of U.S. application Ser. No. 13/201,973, filed Aug. 17, 2011, which is the National Stage of International Application No. PCT/JP2010/001271, filed Feb. 25, 2010, and claims foreign priority to Japanese Application No. 2009-046122, filed Feb. 27, 2009, the entire contents of each of which are incorporated by reference herein.

TECHNICAL FIELD

The present invention relates to an imprint product in which a fine pattern is formed, and a method for producing the same.

BACKGROUND ART

A resin molding product having a fine pattern is useful such as an optical element (such as a micro lens array, an optical waveguide, an optical switch, a Fresnel zone plate, a binary optical element, a blaze optical element, a photonic crystal), an antireflection filter, a biochip, a microreactor chip, a recording medium, a display material, a catalyst support, or the like. In recent years, there has been a demand for further refinement of such patterns, along with a demand for miniaturization of devices. As a method for manufacturing a resin molding product having such a fine structure on the surface, there has been suggested a method for manufacturing an imprint product having a fine pattern formed thereon by transcribing the pattern on a mold having a fine pattern to a resin, that is, a so-called nanoimprint method (for example, Patent Document 1 and Patent Document 2). Furthermore, as a method substituting for a photolithographic method in a process of manufacturing semiconductor, there has been suggested a nanoimprint method of applying a resist on a silicon substrate, pressing thereon a mold on which a fine pattern is formed, and thereby transcribing the fine pattern onto the resist (for example, Patent Document 3 and Patent Document 4).

However, all of the above-described nanoimprint methods have problems that the shape accuracy of the fine pattern in an imprint product is decreased because the mold can not be smoothly released in a process of releasing the mold. Thus, in order to smoothly release the mold, a method of applying a release agent on the mold surface has been attempted. In this case, there is a problem in which the pattern accuracy of the mold is decreased due to unevenness of the thickness of the release agent layer, and there is also a problem in which the releasing agent layer becomes thinning when the mold is continuously used, and it is necessary to reapply the release agent on the mold, which lowers productivity.

In order to solve these problems, a method of using a non-adhesive material having a surface energy of less than about 30 dyn/cm as a mold material (Patent Document 5) has been suggested. Examples of the non-adhesive material include fluoropolymers such as a fluorinated ethylene-propylene copolymer and a tetrafluoroethylene polymer; fluorinated siloxane polymers, and silicones.

However, the method described in Patent Document 5 is to imprint a mold or its negative pattern made of a non-adhesive material onto a photocurable or thermosetting thin film formed on a substrate. That is, the method involves use of a mold pattern or its negative pattern as a lithographic tool. In Patent Document 5, the non-adhesive material is mainly intended to play the role of a releasing agent. Furthermore, a mold using silicone has a low elastic modulus, and it is difficult to imprint a pattern shape accurately as using such a mold.

Furthermore, Patent Document 6 discloses a method of forming a pattern on a transfer layer, which consists of a thermoplastic resin containing a fluorine-containing polymer which has 35% by mass or more of a fluorine content, is pressed with a mold having an inverse pattern of a desired pattern, and thereby forming the desired pattern on the transfer layer; and a step of releasing the mold from the transfer layer. It is described in the document that this method is excellent in the releasability of the transfer layer from a mold and thus can form a fine pattern. Examples of the fluorine-containing polymer include polytetrafluoroethylene, a 1,1,1-trifluoro-2-trifluoromethylpenten-2-ol copolymer, a perfluoro cyclic ether polymer (trade name: Cytop (registered trademark)), and a copolymer of chlorotrifluoroethylene and vinyl ether (trade name: Lumiflon (registered trademark)).

However, when the fluorine content of these polymers is 60% by mass or less, their dimensional accuracy in terms of the depth, width and interval of convex structures is low and dimensional difference is large, because the elastic modulus is rapidly decreased at a temperature above the glass transition temperature, and after the polymer is subjected to press molding, when cooling rapidly, the shrinkage ratio is increased due to the decreased elastic modulus. In addition, even if fluorine content is 60% by mass or more, the fluorine resins such as polytetrafluoroethylene which exhibit a high melting point temperature (Tm), although it is necessary to set the molding temperature markedly higher, provide significant differences in the dimensions between the convex structure mold and the imprint product because of increase in the differences between the elastic modulus and shrinkage ratio during the process of heating and cooling. Furthermore, the fluorine resins must be decomposed when heated at temperature of 300° C. or higher to generate hydrogen fluoride gas, which associate with a high possibility of decomposition of the fluorine resins when heated at the temperature of 260° C. Thus, problems such as corrosion of the mold and peripheral devices, or environmental contamination, are caused.

The imprint methods which comprise molding by heat press as suggested as described above, are required to uniformly put high pressure on a large area in order to obtain an imprint product with a large area, and thus a large-sized heat press molding machine is necessitated. Thus, there is a large problem in manufacturing an imprint product with a large area because of limitations on the area of the imprint product that can be industrially processed.

RELATED DOCUMENT

Patent Document

[Patent Document 1] Japanese Laid-open Patent Publication No. 2004-504718
[Patent Document 2] Japanese Laid-open Patent Publication No. 2002-539604
[Patent Document 3] Japanese Laid-open Patent Publication No. 2000-323461
[Patent Document 4] Japanese Laid-open Patent Publication No. 2003-155365
[Patent Document 5] Japanese Laid-open Patent Publication No. 2005-515617
[Patent Document 6] Japanese Laid-open Patent Publication No. 2006-54300

DISCLOSURE OF THE INVENTION

It is an object of the present invention to provide an imprint product having a fine pattern on the surface, which is formed by transcribing a fine pattern on a mold surface with high dimensional accuracy. The object of the present invention is achieved by using a specific fluorine-containing cyclic olefin polymer and thereby optimizing the changes in the elastic modulus and shrinkage ratio of the resin during the heating and cooling processes in the manufacturing process for a nanoimprint product. Another object of the present invention is to provide a method for manufacturing an imprint product which can efficiently produce an imprint product with high dimensional accuracy, and is capable of obtaining an imprint product with a large area by simple and convenient processes; a method for producing a cured product in which a fine pattern has been transcribed onto the surface of a photocured resin by using the imprint product as a replica mold; and a resin composition for pattern transfer, which is capable of molding the imprint product of the present invention.

The present invention will be described below.

[1] An imprint product on which a fine pattern of a mold surface is transcribed, wherein the imprint product is comprised of a fluorine-containing cyclic olefin polymer containing a repeating structural unit represented by formula (1) and having a fluorine atom content rate of 40% to 75% by mass:

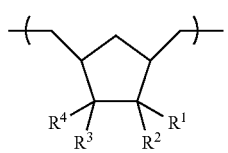

(1)

wherein in the formula (1), at least one of $R^1$ to $R^4$ represents fluorine, a fluorine-containing C1-C10 alkyl, a fluorine-containing C1-C10 alkoxy, or a fluorine-containing C2-C10 alkoxyalkyl; when $R^1$ to $R^4$ represent groups containing no fluorine, $R^1$ to $R^4$ are each selected from hydrogen, a C1-C10 alkyl, a C1-C10 alkoxy, and a C2-C10 alkoxyalkyl; each of $R^1$ to $R^4$ may be identical with or different from the others; and $R^1$ to $R^4$ may be joined together to form a cyclic structure.

[2] The imprint product as set forth in [1], wherein the fluorine-containing cyclic olefin polymer has the variation in the storage modulus or loss modulus thereof obtained by dynamic mechanical analysis by tensile mode at a frequency of 1 Hz and a rate of temperature increase of 3° C./min, which lies in a region of −1 MPa/° C. to 0 MPa/° C. to the changes in temperature in a range of temperature which is not less than the glass transition temperature.

[3] The imprint product as set forth in [2], wherein the region of variation in the storage modulus or loss modulus of the fluorine-containing cyclic olefin polymer in a range of temperature which is not less than the glass transition temperature, lies in a storage modulus region or loss modulus region of 0.1 MPa or more.

[4] The imprint product as set forth in any one of [1] to [3], wherein the fluorine-containing cyclic olefin polymer is composed of a repeating structural unit [A] represented by the formula (1) and a repeating structural unit [B] represented by formula (2), with the molar ratio of the structural units being [A]/[B]=95/5 to 25/75, and has a fluorine atom content rate of 40% to 75% by mass:

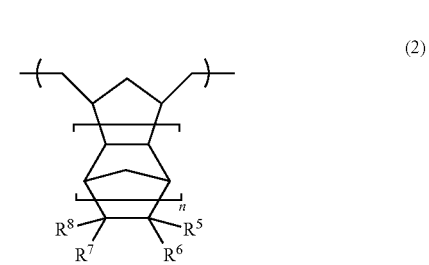

(2)

wherein in the formula (2), at least one of $R^5$ to $R^8$ represents fluorine, a fluorine-containing C1-C10 alkyl, a fluorine-containing C1-C10 alkoxy, or a fluorine-containing C2-C10 alkoxyalkyl; when $R^5$ to $R^8$ represent groups containing no fluorine, $R^5$ to $R^8$ are each selected from hydrogen, a C1-C10 alkyl, a C1-C10 alkoxy, and a C2-C10 alkoxyalkyl; each of $R^5$ to $R^8$ may be identical with or different from the others; $R^5$ to $R^8$ may be joined together to form a cyclic structure; and n represents an integer of 1 or 2.

[5] A method for producing the imprint product using a fluorine-containing cyclic olefin polymer as set forth in any one of [1] to [4], comprising:

bringing a solution containing the fluorine-containing cyclic olefin polymer and an organic solvent into contact with a mold having a fine pattern on the surface and evaporating the solvent to transcribe the pattern of the mold.

[6] A method for producing the imprint product on which a fine pattern of a mold surface is transcribed as set forth in any one of [1] to [4], comprising:

applying a solution containing the fluorine-containing cyclic olefin polymer and an organic solvent on the surface of a mold having a fine pattern, and evaporating the solvent from the solution.

[7] A method for producing the imprint product on which a fine pattern of a mold surface is transcribed as set forth in any one of [1] to [4], comprising:

pressing the surface of a film containing the fluorine-containing cyclic olefin polymer with the surface of a mold having a fine pattern.

[8] A method for producing a cured product by using the imprint product as set forth in any one of [1] to [4] as a mold, comprising:

bringing the surface of the imprint product having a fine pattern into contact with a photocurable monomer composition;

curing the photocurable monomer composition by light irradiation to obtain a cured product; and releasing the cured product from the imprint product.

[9] A resin composition for pattern transcription for obtaining an imprint product on which a fine pattern of a mold surface is transcribed, comprising a fluorine-containing cyclic olefin polymer containing a repeating structural unit represented by formula (1) and having a fluorine atom content rate of 40% to 75% by mass:

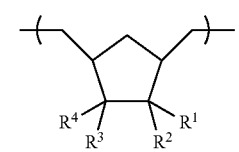

(1)

wherein in the formula (1), at least one of $R^1$ to $R^4$ represents fluorine, a fluorine-containing C1-C10 alkyl, a fluorine-containing C1-C10 alkoxy, or a fluorine-containing C2-C10 alkoxyalkyl; when $R^1$ to $R^4$ represent groups containing no fluorine, $R^1$ to $R^4$ are each selected from hydrogen, a C1-C10 alkyl, a C1-C10 alkoxy, and a C2-C10 alkoxyalkyl; each of $R^1$ to $R^4$ may be identical with or different from the others; and $R^1$ to $R^4$ may be joined together to form a cyclic structure.

[10] The resin composition for pattern transcription as set forth in [9], wherein the fluorine-containing cyclic olefin polymer has the variation in the storage modulus or loss modulus thereof which lies in a region of −1 MPa/° C. to 0 MPa/° C. to the changes in temperature in a range of temperature which is not less than the glass transition temperature.

[11] The resin composition for pattern transcription as set forth in [10], wherein the region of variation in the storage modulus or loss modulus of the fluorine-containing cyclic olefin polymer in a range of temperature which is not less than the glass transition temperature, lies in a storage modulus region or loss modulus region of 0.1 MPa or more.

[12] The resin composition for pattern transcription as set forth in any one of [9] to [11], wherein the fluorine-containing cyclic olefin polymer is composed of a repeating structural unit [A] represented by the formula (1) and a repeating structural unit [B] represented by formula (2), with the molar ratio of the structural units being [A]/[B]=95/5 to 25/75, and has a fluorine atom content rate of 40% to 75% by mass:

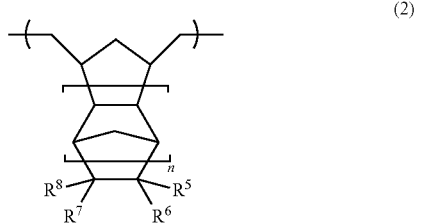

wherein in the formula (2), at least one of $R^5$ to $R^8$ represents fluorine, a fluorine-containing C1-C10 alkyl, a fluorine-containing C1-C10 alkoxy, or a fluorine-containing C2-C10 alkoxyalkyl; when $R^5$ to $R^8$ represent groups containing no fluorine, $R^5$ to $R^8$ are each selected from hydrogen, a C1-C10 alkyl, a C1-C10 alkoxy, and a C2-C10 alkoxyalkyl; each of $R^5$ to $R^8$ may be identical with or different from the others; $R^5$ to $R^8$ may be joined together to form a cyclic structure; and n represents an integer of 1 or 2.

According to the present invention, the term "fine pattern" means a structure having convex portions and concave portions, in which the width of the convex portions and/or concave portions is 10 nm to 50 μm, the depth of the concave portion is 30 nm to 50 μm, and the aspect ratio which is the ratio of the width of the convex portions and the depth of the concave portions is 0.1 to 500.

According to the present invention, the phrase "bringing a solution containing the fluorine-containing cyclic olefin polymer and an organic solvent into contact with a mold having a fine pattern on the surface" includes all of the steps wherein the solution comprised of a polymer and an organic solvent is applied on the mold surface on which a fine pattern is formed, and the steps wherein the solution is applied on a support (substrate), and then the surface of the coating layer is pressed with the mold surface on which a fine pattern is formed. Furthermore, the same also applies to the phrase "bringing the surface of the imprint product having a fine pattern into contact with a photocurable monomer composition."

According to the present invention, since a specific fluorine-containing cyclic olefin polymer having a hydrocarbon structure in the main chain and a fluorine-containing aliphatic cyclic structure in a side chain is used, hydrogen bonding can be formed between the molecules or within the molecule, and thereby changes in the elastic modulus and shrinkage ratio of the resin during the heating and cooling processes in the production process of a nanoimprint imprint product can be optimized. Thus, an imprint product having a fine pattern formed on the surface, which is formed by transcribing a fine pattern of a mold surface with high dimensional accuracy, can be formed, and an imprint product with a large area can be obtained by simple and convenient processes. This imprint product is excellent in releasability and exhibits high production efficiency, such that the imprint product is industrially valuable.

BRIEF DESCRIPTION OF THE DRAWINGS

FIG. 1 is a diagram showing changes in the dynamic viscoelastic modulus measured in a tensile mode of the fluorine-containing cyclic olefin polymer obtained in Example 1, which has a flat region of change of the storage modulus or loss modulus over a temperature region of 113° C. to 152° C.

DESCRIPTION OF EMBODIMENTS

The imprint product of the present invention has a fine pattern which is formed by transcribing a fine pattern of a mold surface, and is comprised of a fluorine-containing cyclic olefin polymer which contains a hydrocarbon structure in the main chain and a fluorine-containing aliphatic cyclic structure in a side chain within a repeating structural unit represented by formula (1), and has a fluorine atom content rate of 40% to 75% by mass.

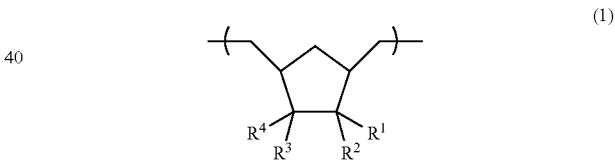

wherein in the formula (1), at least one of $R^1$ to $R^4$ represents fluorine, a fluorine-containing C1-C10 alkyl, a fluorine-containing C1-C10 alkoxy, or a fluorine-containing C2-C10 alkoxyalkyl; when $R^1$ to $R^4$ represent groups containing no fluorine, $R^1$ to $R^4$ are each selected from hydrogen, a C1-C10 alkyl, a C1-C10 alkoxy, and a C2-C10 alkoxyalkyl; $R^1$ to $R^4$ may be identical with or different from each other; and $R^1$ to $R^4$ may be joined together to form a cyclic structure.

More particularly, examples of $R^1$ to $R^4$ in the formula (1) include fluorine; a fluorine-containing C1-C10 alkyl such as an alkyl obtained by substituting a part or all of the hydrogen atoms of an alkyl group with fluorine atoms such as fluoromethyl, difluoromethyl, trifluoromethyl, trifluoroethyl, pentafluoroethyl, heptafluoropropyl, hexafluoroisopropyl, heptafluoroisopropyl, hexafluoro-2-methylisopropyl, perfluoro-2-methylisopropyl, n-perfluorobutyl, n-perfluoropentyl, or perfluorocyclopentyl; a fluorine-containing C1-C10 alkoxy such as an alkoxy obtained by substituting a part or all of the hydrogen atoms of an alkoxy group with fluorine atoms such as fluoromethoxy, difluoromethoxy, trifluoromethoxy, trifluoroethoxy, pentafluoroethoxy, heptafluoropropoxy, hexafluoroisopropoxy, heptafluoroisopropoxy, hexafluoro-2- methylisopropoxy, perfluoro-2-methylisopropoxy, n-perfluorobutoxy, n-perfluoropentoxy, or perfluorocyclopentoxy; and a fluorine-containing C2-C10 alkoxyalkyl such as an alkoxyalkyl obtained by substituting apart or all of the hydrogen atoms of an alkoxy group with fluorine such as fluoromethoxymethyl, difluoromethoxymethyl, trifluoromethoxymethyl, trifluoroethoxymethyl, pentafluoroethoxymethyl, heptafluoropropoxymethyl, hexafluoroisopropoxymethyl, heptafluoroisopropoxymethyl, hexafluoro-2-methylisopropoxymethyl, perfluoro-2-methylisopropoxymethyl, n-perfluorobutoxymethyl, n-perfluoropentoxymethyl, or perfluorocyclopentoxymethyl.

Furthermore, $R^1$ to $R^4$ may be joined together to form a cyclic structure, and may form a ring such as perfluorocycloalkyl or perfluorocycloether interrupted with an oxygen atom.

Examples of the other $R^1$ to $R^4$ that do not contain fluorine include hydrogen; a C1-C10 alkyl such as methyl, ethyl, propyl, isopropyl, 2-methylisopropyl, n-butyl, n-pentyl, or cyclopentyl; a C1-C10 alkoxy such as methoxy, ethoxy, propoxy, butoxy, or pentoxy; and a C2-C10 alkoxyalkyl such as methoxymethyl, ethoxymethyl, propoxymethyl, butoxymethyl, or pentoxymethyl.

The fluorine-containing cyclic olefin polymer according to the present invention may be composed only of the repeating structural unit represented by the formula (1), or may also be composed of two or more kinds of structural units which differ from each other in terms of at least one of $R^1$ to $R^4$ in the formula (1).

Specific examples of the fluorine-containing cyclic olefin polymer containing the repeating structural unit represented by the formula (1) according to the present invention include poly(1-fluoro-2-trifluoromethyl-3,5-cyclopentylene ethylene), poly(1-fluoro-1-trifluoromethyl-3,5-cyclopentylene ethylene), poly(1-methyl-1-fluoro-2-trifluoromethyl-3,5-cyclopentylene ethylene), poly(1,1-difluoro-2-trifluoromethyl-3,5-cyclopentylene ethylene), poly(1,2-difluoro-2-trifluoromethyl-3,5-cyclopentylene ethylene), poly(1-perfluoroethyl-3,5-cyclopentylene ethylene), poly(1,1-bis(trifluoromethyl)-3,5-cyclopentylene ethylene), poly(1,1,2-trifluoro-2-trifluoromethyl-3,5-cyclopentylene ethylene), poly(1,2-bis(trifluoromethyl)-3,5-cyclopentylene ethylene), poly(1-perfluoropropyl-3,5-cyclopentylene ethylene), poly(1-methyl-2-perfluoropropyl-3,5-cyclopentylene ethylene), poly(1-butyl-2-perfluoropropyl-3,5-cyclopentylene ethylene), poly(1-perfluoro-isopropyl-3,5-cyclopentylene ethylene), poly(1-methyl-2-perfluoro-isopropyl-3,5-cyclopentylene ethylene), poly(1,2-difluoro-1,2-bis(trifluoromethyl)-3,5-cyclopentylene ethylene), poly(1,1,2,2,3,3,3a,6a-octafluorocyclopentyl-4,6-cyclopentylene ethylene), poly(1,1,2,2,3,3,4,4,3a,7a-decafluorocyclohexyl-5,7-cyclopentylene ethylene), poly(1-perfluorobutyl-3,5-cyclopentylene ethylene), poly(1-perfluoro-isobutyl-3,5-cyclopentylene ethylene), poly(1-perfluoro-tert-butyl-3,5-cyclopentylene ethylene), poly(1-methyl-2-perfluoro-isobutyl-3,5-cyclopentylene ethylene), poly(1-butyl-2-perfluoro-isobutyl-3,5-cyclopentylene ethylene), poly(1,2-difluoro-1-trifluoromethyl-2-perfluoroethyl-3,5-cyclopentylene ethylene), poly(1-(1-trifluoromethyl-2,2,3,3,4,4,5,5-octafluorocyclopentyl)-3,5-cyclopentylene ethylene), poly(1,1,2-trifluoro-2-perfluorobutyl-3,5-cyclopentylene ethylene), poly(1,2-difluoro-1-trifluoromethyl-2-perfluorobutyl-3,5-cyclopentylene ethylene), poly(1-fluoro-1-perfluoroethyl-2,2-bis(trifluoromethyl)-3,5-cyclopentylene ethylene), poly(1,2-difluoro-1-perfluoropropanyl-2-trifluoromethyl-3,5-cyclopentylene ethylene), poly(1-perfluorohexyl-3,5-cyclopentylene ethylene), poly(1-perfluorohexyl-3,5-cyclopentylene ethylene), poly(1-methyl-2-perfluorohexyl-3,5-cyclopentylene ethylene), poly(1-butyl-2-perfluorohexyl-3,5-cyclopentylene ethylene), poly(1-hexyl-2-perfluorohexyl-3,5-cyclopentylene ethylene), poly(1-octyl-2-perfluorohexyl-3,5-cyclopentylene ethylene), poly(1-perfluoroheptyl-3,5-cyclopentylene ethylene), poly(1-perfluorooctyl-3,5-cyclopentylene ethylene), poly(1-perfluorodecanyl-3,5-cyclopentylene ethylene), poly(1,1,2-trifluoroperfluoropentyl-3,5-cyclopentylene ethylene), poly(1,2-difluoro-1-trifluoromethyl-2-perfluorobutyl-3,5-cyclopentylene ethylene), poly(1,1,2-trifluoroperfluorohexyl-3,5-cyclopentylene ethylene), poly(1,2-difluoro-1-trifluoromethyl-2-perfluoropentyl-3,5-cyclopentylene ethylene), poly(1,2-bis(perfluorobutyl)-3,5-cyclopentylene ethylene), poly(1,2-bis(perfluorohexyl)-3,5-cyclopentylene ethylene), poly(1-methoxy-2-trifluoromethyl-3,5-cyclopentylene ethylene), poly(1-tert-butoxymethyl-2-trifluoromethyl-3,5-cyclopentylene ethylene), and poly(1,1,3,3,3a,6a-hexafluorofuranyl-3,5-cyclopentylene ethylene).

Specific examples of the fluorine-containing cyclic olefin polymer containing the repeating structural unit represented by the formula (1) according to the present invention include poly(1-fluoro-2-trifluoromethyl-3,5-cyclopentylene ethylene), difluoro-1-trifluoromethyl-2-perfluorobutyl-3,5-cyclopentylene ethylene), poly(1,1,2-trifluoro-perfluorohexyl-3,5-cyclopentylene ethylene), poly(1,2-difluoro-1-trifluoromethyl-2-perfluoropentyl-3,5-cyclopentylene ethylene), poly(1,2-bis(perfluorobutyl)-3,5-cyclopentylene ethylene), poly(1,2-bis(perfluorohexyl)-3,5-cyclopentylene ethylene), poly(1-methoxy-2-trifluoromethyl-3,5-cyclopentylene ethylene), poly(1-tert-butoxymethyl-2-trifluoromethyl-3,5-cyclopentylene ethylene), poly(1,1,3,3,3a,6a-hexafluorofuranyl-3,5-cyclopentylene ethylene), poly(1-fluoro-2-trifluoromethoxy-3,5-cyclopentylene ethylene), poly(1-fluoro-1-trifluoromethoxy-3,5-cyclopentylene ethylene), poly(1-methyl-1-fluoro-2-trifluoromethoxy-3,5-cyclopentylene ethylene), poly(1,1-difluoro-2-trifluoromethoxy-3,5-cyclopentylene ethylene), poly(1,2-difluoro-2-trifluoromethoxy-3,5-cyclopentylene ethylene), poly(1-perfluoroethoxy-3,5-cyclopentylene ethylene), poly(1,1-bis(trifluoromethoxy)-3,5-cyclopentylene ethylene), poly(1,1,2-trifluoro-2-trifluoromethoxy-3,5-cyclopentylene ethylene), poly(1,2-bis(trifluoromethoxy)-3,5-cyclopentylene ethylene), poly(1-perfluoropropoxy-3,5-cyclopentylene ethylene), poly(1-methyl-2-perfluoropropoxy-3,5-cyclopentylene ethylene), poly(1-butyl-2-perfluoropropoxy-3,5-cyclopentylene ethylene), poly(1-perfluoro-isopropoxy-3,5-cyclopentylene ethylene), poly(1-methyl-2-perfluoro-isopropoxy-3,5-cyclopentylene ethylene), poly(1,2-difluoro-1,2-bis(trifluoromethoxy)-3,5-cyclopentylene ethylene), poly(1-perfluorobutoxy-3,5-cyclopentylene ethylene), poly(1-perfluoro-isobutoxy-3,5-cyclopentylene ethylene), poly(1-perfluoro-tert-butoxy-3,5-cyclopentylene ethylene), poly(1-methyl-2-perfluoro-isobutoxy-3,5-cyclopentylene ethylene), poly(1-butyl-2-perfluoro-isobutoxy-3,5-cyclopentylene ethylene), poly(1,2-difluoro-1-trifluoromethoxy-2-perfluoroethoxy-3,5-cyclopentylene ethylene), poly(1,1,2-trifluoro-2-perfluorobutoxy-3,5-cyclopentylene ethylene), poly(1,2-difluoro-1-trifluoromethoxy-2-perfluorobutoxy-3,5-cyclopentylene ethylene), poly(1-fluoro-1-perfluoroethoxy-2,2-bis(trifluoromethoxy)-3,5-cyclopentylene ethylene), poly(1,2-difluoro-1-perfluoropropoxy-2-trifluoromethoxy-3,5-cyclopentylene ethylene), poly(1-perfluorohethoxy-3,5-cyclopentylene ethylene), poly(1-methyl-2-perfluorohethoxy-3,5-cyclopentylene ethylene), poly(1-butyl-2-perfluorohethoxy-3,5-cyclopentylene ethylene), poly(1-hexyl-2-perfluorohethoxy-3,5-cyclopentylene ethylene), poly(1-octyl-2-perfluorohethoxy-3,5-cyclopentylene ethylene), poly(1-perfluoroheptoxy-3,5-cyclopentylene ethylene), poly(1-perfluorooctoxy-3,5-cyclopentylene ethylene), poly(1-perfluorodethoxy-3,5-cyclopentylene ethylene), poly(1,1,2-trifluoroperfluoropentoxy-3,5-cyclopentylene ethylene), poly(1,2-difluoro-1-trifluoromethoxy-2-perfluorobutoxy-3,5-cyclopentylene ethylene), poly(1,1,2-trifluoro-2-perfluorohethoxy-3,5-cyclopentylene ethylene), poly(1,2-difluoro-1-trifluoromethoxy-2-perfluoropentyl-3,5-cyclopentylene ethylene), poly(1,2-bis(perfluorobutoxy)-3,5-cyclopentylene ethylene), poly(1,2-bis(perfluoroethoxy)-3,5-cyclopentylene ethylene), poly(1-methoxy-2-trifluoromethoxy-3,5-cyclopentylene ethylene), poly(1-tert-butoxymethyl-2-trifluoromethoxy-3,5-cyclopentylene ethylene), poly(1-(2',2',2'-trifluoroethoxy)-3,5-cyclopentylene ethylene), poly(1-(2',2',3',3',3'-pentafluoropropoxy)-3,5-cyclopentylene ethylene), poly(1-methyl-2-(2',2',3',3',3'-pentafluoropropoxy)-3,5-cyclopentylene ethylene), poly(1-butyl-2-(2',2',3',3',3'-pentafluoropropoxy)-3,5-cyclopentylene ethylene), poly(1-(1',1',1'-trifluoro-isopropoxy)-3,5-cyclopentylene ethylene), poly(1-methyl-(1',1',1'-trifluoro-isopropoxy)-3,5-cyclopentylene ethylene), poly(1-(2',2',3',3',4',4'-heptafluorobutoxy)-3,5-cyclopentylene ethylene), poly(1-(1',1',1'-trifluoro-isobutoxy)-3,5-cyclopentylene ethylene), poly(1-(1',1',1'-trifluoro-isobutoxy)-3,5-cyclopentylene ethylene), poly(1-methyl-2-(1',1',1'-trifluoro-isobutoxy)-3,5-cyclopentylene ethylene), poly(1-butyl-2-(1',1',1'-trifluoro-isobutoxy)-3,5-cyclopentylene ethylene), poly(1,2-difluoro-1-trifluoromethoxy-2-(2',2',2'-trifluoroethoxy)-3,5-cyclopentylene ethylene), poly(1,1,2-trifluoro-2-(2',2',3',3',4',4',4'-heptafluorobutoxy)-3,5-cyclopentylene ethylene), poly(1,2-difluoro-1-trifluoromethoxy-2-(2',2',3',3',4',4',4'-hepta fluorobutoxy)-3,5-cyclopentylene ethylene), poly(1-fluoro-1-(2',2',2'-trifluoroethoxy)-2,2-bis(trifluoromethoxy)-3,5-cyclopentylene ethylene), poly(1,2-difluoro-1-(2',2',3',3',3'-pentafluoropropoxy)-2-trifluoromethoxy-3,5-cyclopentylene ethylene), poly(1-(2',2',3',3',4',4',5',5',6',6',6'-undecafluorohethoxy)-3,5-cyclopentylene ethylene), poly(1-methyl-2-(2',2',3',3',4',4',5',5',6',6',6'-undecafluorohethoxy)-3,5-cyclopentylene ethylene), poly(1-butyl-2-(2',2',3',3',4',4',5',5',6',6',6'-undecafluorohethoxy)-3,5-cyclopentylene ethylene), poly(1-hexyl-2-(2',2',3',3',4',4',5',5',6',6',6'-undecafluoroheptoxy)-3,5-cyclopentylene ethylene), poly(1-octyl-2-(2',2',3',3',4',4',5',5',6',6',6'-undecafluorohethoxy)-3,5-cyclopentylene ethylene), poly(1-(2',2',3',3',4',4',5',5',6',6',7',7,7'-tridecafluoroheptoxy)-3,5-cyclopentylene ethylene), poly(1-(2',2',3',3',4',4',5',5',6',6',7',7',8',8',8'-pentadecafluorooctoxy)-3,5-cyclopentylene ethylene), poly(1-(2',2',3',3',4',4',5',5',6',6',7',7',8',8',9',9',9'-heptadecafluorodethoxy)-3,5-cyclopentylene ethylene), poly(1,1,2-trifluoro-2-(1',1',1'-trifluoro-isopropoxy)-3,5-cyclopentylene ethylene), poly(1,2-difluoro-1-trifluoromethoxy-2-(2',2',3',3',4',4',4'-hepta fluorobutoxy)-3,5-cyclopentylene ethylene), poly(1,1,2-trifluoro-(2',2',3',3',4',4',5',5',6',6',6'-undecafluorohethoxy)-3,5-cyclopentylene ethylene), poly(1,2-bis(2',2',3',3',4',4',4'-heptafluorobutoxy)-3,5-cyclopentylene ethylene), and poly(1,2-bis(2',2',3',3',4',4',5',5',6',6',6'-undecafluorohethoxy)-3,5-cyclopentylene ethylene).

Furthermore, in the present invention, the fluorine-containing cyclic olefin copolymer having the repeating structural unit [A] represented by the formula (1) and the repeating structural unit [B] represented by the following formula (2) has a molar ratio of the structural unit [A] and the structural unit [B] of [A]/[B]=95/5 to 25/75, and has a fluorine atom content rate of 40% to 75% by mass. In addition, the structural unit [A] does not contain the repeating structural unit represented by the formula (2).

Thereby, an imprint product which has enhanced heat resistance of the film while maintaining satisfactory releasability, and has improved scratch resistance of the film surface, can be obtained. In regard to the glass transition temperature as an index representing the heat resistance of the film, if the rigid aliphatic cyclic structure of the structural unit [B] represented by the formula (2) is introduced, the mobility of the polymer under heating is decreased as compared with a polymer having only the structural unit [A] represented by the formula (1). As a results, the glass transition temperature increases without impairing the characteristics of the fluorine-containing polymer. Thus, the heat resistance of the film can be enhanced.

Unless particularly stated otherwise in the following descriptions, the fluorine-containing cyclic olefin polymer may include a fluorine-containing cyclic olefin copolymer.

Furthermore, the fluorine-containing cyclic olefin copolymer having the repeating structural unit [A] represented by the formula (1) and the repeating structural unit [B] represented by the following formula (2) can have improved surface hardness such as pencil hardness and can have improved scratch resistance of the film surface, by introducing the rigid cyclic structure of the repeating structural unit [B]. When the ratio [A]/[B] is less than 95/5, the effect of enhancing heat resistance and the effect of improving scratch resistance of the film surface are low. The molar ratio is preferably such that [A]/[B]=90/10 to 25/75.

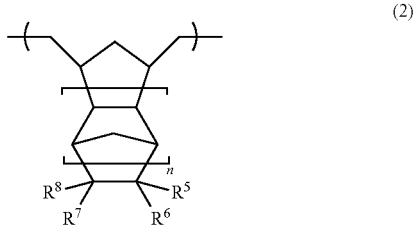

(2)

wherein in the formula (2), at least one of $R^5$ to $R^8$ represents fluorine, a fluorine-containing C1-C10 alkyl, a fluorine-containing C1-C10 alkoxy, or a fluorine-containing C2-C10 alkoxyalkyl; when $R^5$ to $R^8$ represent groups containing no fluorine, $R^5$ to $R^8$ are each selected from hydrogen, a C1-C10 alkyl, a C1-C10 alkoxy, and a C2-C10 alkoxyalkyl; $R^5$ to $R^8$ may be identical with or different from each other; $R^5$ to $R^8$ may be joined together to form a cyclic structure; and n represents an integer of 1 or 2.

The fluorine-containing cyclic olefin copolymer according to the present invention is such that $R^1$ to $R^4$ of the repeating structural unit represented by the formula (1) and $R^5$ to $R^8$ of the repeating structural unit represented by the formula (2) may be identical or different, and $R^1$ to $R^4$ or $R^5$ to $R^8$ may be composed of two or more kinds of structural units that are different from each other.

Specific examples of the fluorine-containing cyclic olefin polymer containing the repeating structural unit represented by the formula (2) according to the present invention include
poly(3-fluoro-4-trifluoromethyl-7,9-tricyclo[4.3.0.1$^{2,5}$]decanylene ethylene),
poly(3-fluoro-3-trifluoromethyl-7,9-tricyclo[4.3.0.1$^{2,5}$]decanylene ethylene),
poly(3-methyl-3-fluoro-4-trifluoromethyl-7,9-tricyclo[4.3.0.1$^{2,5}$]decanylene ethylene),
poly(3,3-difluoro-4-trifluoromethyl-7,9-tricyclo[4.3.0.1$^{2,5}$]decanylene ethylene),
poly(3,4-difluoro-4-trifluoromethyl-7,9-tricyclo[4.3.0.1$^{2,5}$]decanylene ethylene),
poly(3-perfluoroethyl-7,9-tricyclo[4.3.0.1$^{2,5}$]decanylene ethylene),
poly(3,3-bis(trifluoromethyl)-7,9-tricyclo[4.3.0.1$^{2,5}$]decanylene ethylene),
poly(3,3,4-trifluoro-4-trifluoromethyl-7,9-tricyclo[4.3.0.1$^{2,5}$]decanylene ethylene),
poly(3,4-bistrifluoromethyl-7,9-tricyclo[4.3.0.1$^{2,5}$]decanylene ethylene),
poly(3-perfluoropropyl)-7,9-tricyclo[4.3.0.1$^{2,5}$]decanylene ethylene),
poly(3-methyl-4-perfluoropropyl-7,9-tricyclo[4.3.0.1$^{2,5}$]decanylene ethylene),
poly(3-butyl-4-perfluoropropyl-7,9-tricyclo[4.3.0.1$^{2,5}$]decanylene ethylene),
poly(3-perfluoro-isopropyl-7,9-tricyclo[4.3.0.1$^{2,5}$]decanylene ethylene),
poly(3-methyl-9-perfluoro-isopropyl-7,9-tricyclo[4.3.0.1$^{2,5}$]decanyl ene ethylene),
poly(3,4-difluoro-3,4-bis(trifluoromethyl)-7,9-tricyclo[4.3.0.1$^{2,5}$]decanylene ethylene),
poly(2,3,3,4,4,5,5,6-octafluoro-9,11-tetracyclo[5.5.1.0$^{2,6}$.0$^{8,12}$]tridecanylene ethylene),
poly(2,3,3,4,4,5,5,6,6,7-decafluoro-10,12-tetracyclo[6.5.1.0$^{2,7}$.0$^{9,13}$]tetradecanylene ethylene),
poly(3-perfluorobutyl-7,9-tricyclo[4.3.0.1$^{2,5}$]decanylene ethylene),
poly(3-perfluoro-isobutyl-7,9-tricyclo[4.3.0.1$^{2,5}$]decanylene ethylene),
poly(3-perfluoro-tert-butyl-7,9-tricyclo[4.3.0.1$^{2,5}$]decanylene ethylene),
poly(3-methyl-4-perfluoro-tert-butyl-7,9-tricyclo[4.3.0.1$^{2,5}$]decanylene ethylene),
poly(3-butyl-4-perfluoro-tert-butyl-7,9-tricyclo[4.3.0.1$^{2,5}$]decanylene ethylene),
poly(3,4-dimethyl-3-perfluoro-tert-butyl-7,9-tricyclo[4.3.0.1$^{2,5}$]decanylene ethylene),
poly(3,3,4-trifluoro-4-perfluorobutyl-7,9-tricyclo[4.3.0.1$^{2,5}$]decanylene ethylene),
poly(3,4-difluoro-3-trifluoromethyl-4-perfluorobutyl-7,9-tricyclo[4.3.0.1$^{2,5}$]decanylene ethylene),
poly(3-fluoro-3-perfluoroethyl-4,4-bis(trifluoromethyl)-7,9-tricyclo[4.3.0.1$^{2,5}$]decanylene ethylene),
poly(3,4-difluoro-3-perfluoropropanyl-4-trifluoromethyl-7,9-tricyclo[4.3.0.1$^{2,5}$]decanylene ethylene),
poly(3-perfluorohexyl-7,9-tricyclo[4.3.0.1$^{2,5}$]decanylene ethylene),
poly(3-methyl-4-perfluorohexyl-7,9-tricyclo[4.3.0.1$^{2,5}$]decanylene ethylene),
poly(3-butyl-4-perfluorohexyl-7,9-tricyclo[4.3.0.1$^{2,5}$]decanylene ethylene),
poly(3-hexyl-4-perfluorohexyl-7,9-tricyclo[4.3.0.1$^{2,5}$]decanylene ethylene),
poly(3-octyl-4-perfluorohexyl-7,9-tricyclo[4.3.0.1$^{2,5}$]decanylene ethylene),
poly(3-perfluoroheptyl-7,9-tricyclo[4.3.0.1$^{2,5}$]decanylene ethylene),
poly(3,3,4-trifluoro-4-perfluoropentyl-7,9-tricyclo[4.3.0.1$^{2,5}$]decanylene ethylene),
poly(3,4-difluoro-3-trifluoromethyl-4-perfluorobutyl-7,9-tricyclo[4.3.0.1$^{2,5}$]decanylene ethylene),
poly(3,3,4-trifluoro-3-perfluorohexyl-7,9-tricyclo[4.3.0.1$^{2,5}$]decan ylene ethylene),
poly(3,4-difluoro-3-trifluoromethyl-4-perfluoropentyl-7,9-tricyclo[4.3.0.1$^{2,5}$]decanylene ethylene),
poly(3,4-bis(perfluorobutyl)-7,9-tricyclo[4.3.0.1$^{2,5}$]decanylene ethylene),
poly(3,4-bis(perfluorohexyl)-7,9-tricyclo[4.3.0.1$^{2,5}$]decanylene ethylene),
poly(3-methoxy-4-trifluoromethyl-7,9-tricyclo[4.3.0.1$^{2,5}$]decanylene ethylene),
poly(3-tert-butoxymethyl-4-trifluoromethyl-7,9-tricyclo[4.3.0.1$^{2,5}$]decanylene ethylene),
poly(4-fluoro-5-trifluoromethyl-10,12-pentacyclo[6.5.1.0$^{2,7}$.0$^{9,13}$.1$^{3,6}$]pentadecanylene ethylene),
poly(4-methyl-5-fluoro-5-trifluoromethyl-10,12-pentacyclo[6.5.1.0$^{2,7}$.0$^{9,13}$.1$^{3,6}$]pentadecanylene ethylene),
poly(4,4-difluoro-5-trifluoromethyl-10,12-pentacyclo[6.5.1.0$^{2,7}$.0$^{9,13}$.1$^{3,6}$]pentadecanylene ethylene),
poly(4-perfluoroethyl-10,12-pentacyclo[6.5.1.0$^{2,7}$.0$^{9,13}$.1$^{3,6}$]pentadecanylene ethylene),
poly(4,4-bis(trifluoromethyl)-10,12-pentacyclo[6.5.1.0$^{2,7}$.0$^{9,13}$.1$^{3,6}$]pentadecanylene ethylene),
poly(4,4,5-trifluoro-5-trifluoromethyl-10,12-pentacyclo[6.5.1.0$^{2,7}$.0$^{9,13}$.1$^{3,6}$]pentadecanylene ethylene),
poly(4,5-bis(trifluoromethyl)-10,12-pentacyclo[6.5.1.0$^{2,7}$.0$^{9,13}$.1$^{3,6}$]pentadecanylene ethylene), poly(4-perfluoropropyl-10,12-pentacyclo[6.5.1.0$^{2,7}$.0$^{9,13}$.1$^{3,6}$]pentadecanylene ethylene),
poly(4-methyl-5-perfluoropropyl-10,12-pentacyclo[6.5.1.0$^{2,7}$.0$^{9,13}$.1$^{3,6}$]pentadecanylene ethylene),
poly(4-methyl-5-perfluoropropyl-10,12-pentacyclo[6.5.1.0$^{2,7}$.0$^{9,13}$.1$^{3,6}$]pentadecanylene ethylene),
poly(4-butyl-5-perfluoropropyl-10,12-pentacyclo[6.5.1.0$^{2,7}$.0$^{9,13}$.1$^{3,6}$]pentadecanylene ethylene),
poly(4-perfluoro-isopropyl-10,12-pentacyclo[6.5.1.0$^{2,7}$.0$^{9,13}$.1$^{3,6}$]pentadecanylene ethylene),
poly(4-methyl-5-perfluoro-isopropyl-10,12-pentacyclo[6.5.1.0$^{2,7}$.0$^{9,13}$.1$^{3,6}$]pentadecanylene ethylene),
poly(4,5-difluoro-4,5-bis(trifluoromethyl)-10,12-pentacyclo[6.5.1.0$^{2,7}$.0$^{9,13}$.1$^{3,6}$]pentadecanylene ethylene),
poly(3,4,4,5,5,6,6,7-octafluoro-12,14-hexacyclo[7.7.0.1$^{2,8}$.1$^{10,16}$.0$^{3,7}$.0$^{11,15}$]octadecanylene ethylene),
poly(3,4,4,5,5,6,6,7,7,8-decafluoro-13,15-hexacyclo[8.7.0.1$^{2,9}$.1$^{11,17}$.0$^{3,8}$.0$^{12,16}$]nonadecanylene ethylene),
poly(4-perfluorobutyl-10,12-pentacyclo[6.5.1.0$^{2,7}$.0$^{9,13}$.1$^{3,6}$]pentadecanylene ethylene),
poly(4-perfluoro-isobutyl-10,12-pentacyclo[6.5.1.0$^{2,7}$.0$^{9,13}$.1$^{3,6}$]pentadecanylene ethylene),
poly(4-methyl-5-tert-butyl-10,12-pentacyclo[6.5.1.0$^{2,7}$.0$^{9,13}$.1$^{3,6}$]pentadecanylene ethylene),
poly(4-butyl-5-tert-butyl-10,12-pentacyclo[6.5.1.0$^{2,7}$.0$^{9,13}$.1$^{3,6}$]pentadecanylene ethylene),
poly(4,5-methyl-4-tert-butyl-10,12-pentacyclo[6.5.1.0$^{2,7}$.0$^{9,13}$.1$^{3,6}$]pentadecanylene ethylene),
poly(4,4,5-trifluoro-6-perfluorobutyl-10,12-pentacyclo[6.5.1.0$^{2,7}$.0$^{9,13}$.1$^{3,6}$]pentadecanylene ethylene),
poly(4,6-difluoro-4-trifluoromethyl-5-perfluorobutyl-10,12-pentacyclo[6.5.1.0$^{2,7}$.0$^{9,13}$.1$^{3,6}$]pentadecanylene ethylene),
poly(4-fluoro-4-perfluoroethyl-5,5-bis(trifluoromethyl)-10,12-pentacyclo[6.5.1.0$^{2,7}$.0$^{9,13}$.1$^{3,6}$]pentadecanylene ethylene),
poly(4,5-difluoro-4-perfluoropropanyl-5-trifluoromethyl-10,12-pentacyclo[6.5.1.0$^{2,7}$.0$^{9,13}$.1$^{3,6}$]pentadecanylene ethylene),
poly(4-perfluorohexyl-10,12-pentacyclo[6.5.1.0$^{2,7}$.0$^{9,13}$.1$^{3,6}$]pentadecanylene ethylene),
poly(4-methyl-5-perfluorohexyl-10,12-pentacyclo[6.5.1.0$^{2,7}$.0$^{9,13}$.1$^{3,6}$]pentadecanylene ethylene),
poly(4-butyl-5-perfluorohexyl-10,12-pentacyclo[6.5.1.0$^{2,7}$.0$^{9,13}$.1$^{3,6}$]pentadecanylene ethylene),
poly(4-hexyl-5-perfluorohexyl-10,12-pentacyclo[6.5.1.0$^{2,7}$.0$^{9,13}$.1$^{3,6}$]pentadecanylene ethylene),
poly(4-octyl-5-perfluorohexyl-10,12-pentacyclo[6.5.1.0$^{2,7}$.0$^{9,13}$.1$^{3,6}$]pentadecanylene ethylene),
poly(4-perfluoroheptyl-10,12-pentacyclo[6.5.1.0$^{2,7}$.0$^{9,13}$.1$^{3,6}$]pentadecanylene ethylene),
poly(4-perfluorooctyl-10,12-pentacyclo[6.5.1.0$^{2,7}$.0$^{9,13}$.1$^{3,6}$]pentadecanylene ethylene),
poly(4-perfluorodecanyl-10,12-pentacyclo[6.5.1.0$^{2,7}$.0$^{9,13}$.1$^{3,6}$]pentadecanylene ethylene),
poly(4,4,5-trifluoro-6-perfluoropentyl-10,12-pentacyclo[6.5.1.0$^{2,7}$.0$^{9,13}$.1$^{3,6}$]pentadecanylene ethylene),
poly(4,5-difluoro-4-trifluoromethyl-6-perfluorobutyl-10,12-pentacyclo[6.5.1.0$^{2,7}$.0$^{9,13}$.1$^{3,6}$]pentadecanylene ethylene),
poly(4,4,5-trifluoro-12-perfluorohexyl-10,12-pentacyclo[6.5.1.0$^{2,7}$.0$^{9,13}$.1$^{3,6}$]pentadecanylene ethylene),
poly(4,5-difluoro-4-trifluoromethyl-5-perfluoropentyl-10,12-pentacyclo[6.5.1.0$^{2,7}$.0$^{9,13}$.1$^{3,6}$]pentadecanylene ethylene),
poly(4,4,5-tris(trifluoromethyl)-5-perfluoro-tert-butyl-10,12-pentacyclo[6.5.1.0$^{2,7}$.0$^{9,13}$.1$^{3,6}$]pentadecanylene ethylene),
poly(4,5-bis(perfluorohexyl)-10,12-pentacyclo[6.5.1.0$^{2,7}$.0$^{9,13}$.1$^{3,6}$]pentadecanylene ethylene),
poly(4-methoxy-5-trifluoromethyl-10,12-pentacyclo[6.5.1.0$^{2,7}$.0$^{9,13}$.1$^{3,6}$]pentadecanylene ethylene),
poly(3-fluoro-4-trifluoromethoxy-7,9-tricyclo[4.3.0.1$^{2,5}$]decanylene ethylene),
poly(3-fluoro-4-trifluoromethoxy-7,9-tricyclo[4.3.0.1$^{2,5}$]decanylene ethylene),
poly(3-methyl-3-fluoro-4-trifluoromethoxy-7,9-tricyclo[4.3.0.1$^{2,5}$]decanylene ethylene),
poly(3,3-difluoro-4-trifluoromethoxy-7,9-tricyclo[4.3.0.1$^{2,5}$]decanylene ethylene),
poly(3,4-difluoro-4-trifluoromethoxy-7,9-tricyclo[4.3.0.1$^{2,5}$]decanylene ethylene),
poly(3-perfluoroethoxy-7,9-tricyclo[4.3.0.1$^{2,5}$]decanylene ethylene),
poly(3,3,4-trifluoro-4-trifluoromethoxy-7,9-tricyclo[4.3.0.1$^{2,5}$]decanylene ethylene),
poly(3,4-bis(trifluoromethoxy)-7,9-tricyclo[4.3.0.1$^{2,5}$]decanylene ethylene),
poly(3-perfluoropropoxy-7,9-tricyclo[4.3.0.1$^{2,5}$]decanylene ethylene),
poly(3-methyl-4-perfluoropropoxy-7,9-tricyclo[4.3.0.1$^{2,5}$]decanylene ethylene),
poly(3-butyl-4-perfluoropropoxy-7,9-tricyclo[4.3.0.1$^{2,5}$]decanylene ethylene),
poly(3-perfluoro-isopropoxy-7,9-tricyclo[4.3.0.1$^{2,5}$]decanylene ethylene),
poly(3-methyl-4-perfluoro-isopropoxy-7,9-tricyclo[4.3.0.1$^{2,5}$]decanylene ethylene),
poly(3,4-difluoro-3,4-bis(trifluoromethoxy)-7,9-tricyclo[4.3.0.1$^{2,5}$]decanylene ethylene),
poly(3-perfluorobutoxy-7,9-tricyclo[4.3.0.1$^{2,5}$]decanylene ethylene),
poly(3-perfluoro-isobutoxy-7,9-tricyclo[4.3.0.1$^{2,5}$]decanylene ethylene),
poly(3-perfluoro-tert-7,9-tricyclo[4.3.0.1$^{2,5}$]decanylene ethylene),
poly(3-methyl-4-perfluoro-isobutoxy-7,9-tricyclo[4.3.0.1$^{2,5}$]decanylene ethylene),
poly(3-butyl-4-perfluoro-isobutoxy-7,9-tricyclo[4.3.0.1$^{2,5}$]decanylene ethylene),
poly(3,4-difluoro-3-trifluoromethoxy-4-perfluoroethoxy-7,9-tricyclo[4.3.0.1$^{2,5}$]decanylene ethylene),
poly((3,3,4-trifluoro-4-perfluorobutoxy)-7,9-tricyclo[4.3.0.1$^{2,5}$]decanylene ethylene),
poly(3,4-difluoro-3-trifluoromethoxy-4-perfluorobutoxy-7,9-tricyclo[4.3.0.1$^{2,5}$]decanylene ethylene),
poly(3-fluoro-3-perfluoroethoxy-2,2-bis(trifluoromethoxy)-7,9-tricyclo[4.3.0.1$^{2,5}$]decanylene ethylene),
poly(3,4-difluoro-3-perfluoropropoxy-4-trifluoromethoxy)-7,9-tricyclo[4.3.0.1$^{2,5}$]decanylene ethylene),
poly(3-perfluorohethoxy-7,9-tricyclo[4.3.0.1$^{2,5}$]decanylene ethylene),
poly(3-methyl-4-perfluorohethoxy-7,9-tricyclo[4.3.0.1$^{2,5}$]decanylene ethylene),
poly(3-butyl-4-perfluorohethoxy-7,9-tricyclo[4.3.0.1$^{2,5}$]decanylene ethylene),
poly(3-hexyl-4-perfluorohethoxy-7,9-tricyclo[4.3.0.1$^{2,5}$]decanylene ethylene),
poly(3-octyl-4-perfluorohethoxy-7,9-tricyclo[4.3.0.1$^{2,5}$]decanylene ethylene),
poly(3-perfluoroheptoxy-7,9-tricyclo[4.3.0.1$^{2,5}$]decanylene ethylene), poly(3-perfluorooctoxy-7,9-tricyclo[4.3.0.1$^{2,5}$]decanylene ethylene),
poly(3-perfluorodethoxy-7,9-tricyclo[4.3.0.1$^{2,5}$]decanylene ethylene),
poly(3,3,4-trifluoroperfluoropentoxy-7,9-tricyclo[4.3.0.1$^{2,5}$]decanylene ethylene),
poly(3,4-difluoro-3-trifluoromethoxy-4-perfluorobutoxy-7,9-tricyclo[4.3.0.1$^{2,5}$]decanylene ethylene),
poly(3,3,4-trifluoro-4-perfluorohethoxy-7,9-tricyclo[4.3.0.1$^{2,5}$]decanylene ethylene),
poly(3,4-difluoro-3-trifluoromethoxy-4-perfluoropentyl-7,9-tricyclo[4.3.0.1$^{2,5}$]decanylene ethylene),
poly(3,4-bis(perfluorobutoxy)-7,9-tricyclo[4.3.0.1$^{2,5}$]decanylene ethylene),
poly(3,4-bis(perfluorohethoxy)-7,9-tricyclo[4.3.0.1$^{2,5}$]decanylene ethylene),
poly(3-methoxy-4-trifluoromethoxy-7,9-tricyclo[4.3.0.1$^{2,5}$]decanylene ethylene),
poly(3-tert-butoxymethyl-4-trifluoromethoxy-7,9-tricyclo[4.3.0.1$^{2,5}$]decanylene ethylene),
poly(3-(2',2',2'-trifluoroethoxy)-7,9-tricyclo[4.3.0.1$^{2,5}$]decanylene ethylene),
poly(3-(2',2',3',3',3'-pentafluoropropoxy)-7,9-tricyclo[4.3.0.1$^{2,5}$]decanylene ethylene),
poly(3-methyl-4-(2',2',3',3',3'-pentafluoropropoxy)-7,9-tricyclo[4.3.0.1$^{2,5}$]decanylene ethylene),
poly(3-butyl-4-(2',2',3',3',3'-pentafluoropropoxy)-7,9-tricyclo[4.3.0.1$^{2,5}$]decanylene ethylene),
poly(3-(1',1',1'-trifluoro-isopropoxy)-7,9-tricyclo[4.3.0.1$^{2,5}$]decanylene ethylene),
poly(3-methyl-(1',1',1'-trifluoro-isopropoxy)-7,9-tricyclo[4.3.0.1$^{2,5}$]decanylene ethylene),
poly(3-(2',2',3',3',4',4',4'-heptafluorobutoxy)-7,9-tricyclo[4.3.0.1$^{2,5}$]decanylene ethylene),
poly(3-(1',1',1'-trifluoro-isobutoxy)-7,9-tricyclo[4.3.0.1$^{2,5}$]decanylene ethylene),
poly(3-(1',1',1'-trifluoro-isobutoxy)-7,9-tricyclo[4.3.0.1$^{2,5}$]decanylene ethylene),
poly(3-methyl-4-(1',1',1'-trifluoro-isobutoxy)-7,9-tricyclo[4.3.0.1$^{2,5}$]decanylene ethylene),
poly(3-butyl-4-(1',1',1'-trifluoro-isobutoxy)-7,9-tricyclo[4.3.0.1$^{2,5}$]decanylene ethylene),
poly(3,4-difluoro-3-trifluoromethoxy-4-(2',2',2'-trifluoroethoxy)-7,9-tricyclo[4.3.0.1$^{2,5}$]decanylene ethylene),
poly(3,3,4-trifluoro-4-(2',2',3',3',4',4',4'-heptafluorobutoxy)-7,9-tricyclo[4.3.0.1$^{2,5}$]decanylene ethylene),
poly(3,4-difluoro-3-trifluoromethoxy-4-(2',2',3',3',4',4',4'-hepta fluorobutoxy)-7,9-tricyclo[4.3.0.1$^{2,5}$]decanylene ethylene),
poly(3-fluoro-3-(2',2',2'-trifluoroethoxy)-4,4-bis(trifluoromethoxy)-7,9-tricyclo[4.3.0.1$^{2,5}$]decanylene ethylene),
poly(3,4-difluoro-3-(2',2',3',3',3'-pentafluoropropoxy)-4-trifluoromethoxy)-7,9-tricyclo[4.3.0.1$^{2,5}$]decanylene ethylene),
poly(3-(2',2',3',3',4',4',5',5',6',6',6'-undecafluorohethoxy)-7,9-tricyclo[4.3.0.1$^{2,5}$]decanylene ethylene),
poly(3-methyl-4-(2',2',3',3',4',4',5',5',6',6',6'-undecafluorohethoxy)-7,9-tricyclo[4.3.0.1$^{2,5}$]decanylene ethylene),
poly(3-butyl-4-(2',2',3',3',4',4',5',5',6',6',6'-undecafluorohethoxy)-7,9-tricyclo[4.3.0.1$^{2,5}$]decanylene ethylene),
poly(3-hexyl-4-(2',2',3',3',4',4',5',5',6',6',6'-undecafluorohethoxy)-7,9-tricyclo[4.3.0.1$^{2,5}$]decanylene ethylene),
poly(3-octyl-4-(2',2',3',3',4',4',5',5',6',6',6'-undecafluorohethoxy)-7,9-tricyclo[4.3.0.1$^{2,5}$]decanylene ethylene),
poly(3-(2',2',3',3',4',4',5',5',6',6',7',7',7'-tridecafluoroheptoxy)-7,9-tricyclo[4.3.0.1$^{2,5}$]decanylene ethylene),
poly(3-(2',2',3',3',4',4',5',5',6',6',7',7',8',8',8'-pentadecafluorooctoxy)-7,9-tricyclo[4.3.0.1$^{2,5}$]decanylene ethylene),
poly(3-(2',2',3',3',4',4',5',5',6',6',7',7',8',8',9',9',9'-heptadecafluorodethoxy 7,9-tricyclo[4.3.0.1$^{2,5}$]decanylene ethylene),
poly(3,3,4-trifluoro-4-(1',1',1'-trifluoro-isopropoxy)-7,9-tricyclo[4.3.0.1$^{2,5}$]decanylene ethylene),
poly(3,4-difluoro-3-trifluoromethoxy-4-(2',2',3',3',4',4',4'-heptafluorobutoxy)-7,9-tricyclo[4.3.0.1$^{2,5}$]decanylene ethylene),
poly(3,3,4-trifluoro-(2',2',3',3',4',4',5',5',6',6',6'-undecafluorohethoxy)-7,9-tricyclo[4.3.0.1$^{2,5}$]decanylene ethylene),
poly(3,4-bis(2',2',3',3',4',4',4'-heptafluorobutoxy)-7,9-tricyclo[4.3.0.1$^{2,5}$]decanylene ethylene),
poly(3,4-bis(2',2',3',3',4',4',5',5',6',6',6'-undecafluorohethoxy)-7,9-tricyclo[4.3.0.1$^{2,5}$]decanylene ethylene),
poly(4-fluoro-5-trifluoromethoxy-10,12-pentacyclo[6.5.1.0$^{2,7}$.0$^{9,13}$.1$^{3,6}$]pentadecanylene ethylene),
poly(4-fluoro-5-trifluoromethoxy-10,12-pentacyclo[6.5.1.0$^{2,7}$.0$^{9,13}$.1$^{3,6}$]pentadecanylene ethylene),
poly(4-methyl-4-fluoro-5-trifluoromethoxy-10,12-pentacyclo[6.5.1.0$^{2,7}$.0$^{9,13}$.1$^{3,6}$]pentadecanylene ethylene),
poly(4,4-difluoro-5-trifluoromethoxy-10,12-pentacyclo[6.5.1.0$^{2,7}$.0$^{9,13}$.1$^{3,6}$]pentadecanylene ethylene),
poly(4,5-difluoro-5-trifluoromethoxy-10,12-pentacyclo[6.5.1.0$^{2,7}$.0$^{9,13}$.1$^{3,6}$]pentadecanylene ethylene),
poly(4-perfluoroethoxy-7,9-tricyclo[4.3.0.1$^{2,5}$]decanylene ethylene),
poly(4,4,5-trifluoro-5-trifluoromethoxy-10,12-pentacyclo[6.5.1.0$^{2,7}$.0$^{9,13}$.1$^{3,6}$]pentadecanylene ethylene),
poly(4,5-bis(trifluoromethoxy)-10,12-pentacyclo[6.5.1.0$^{2,7}$.0$^{9,13}$.1$^{3,6}$]pentadecanylene ethylene),
poly(4-perfluoropropoxy-10,12-pentacyclo[6.5.1.0$^{2,7}$.0$^{9,13}$.1$^{3,6}$]pentadecanylene ethylene),
poly(4-methyl-5-perfluoropropoxy-10,12-pentacyclo[6.5.1.0$^{2,7}$.0$^{9,13}$.1$^{3,6}$]pentadecanylene ethylene),
poly(4-butyl-5-perfluoropropoxy-10,12-pentacyclo[6.5.1.0$^{2,7}$.0$^{9,13}$.1$^{3,6}$]pentadecanylene ethylene),
poly(4-perfluoro-isopropoxy-10,12-pentacyclo[6.5.1.0$^{2,7}$.0$^{9,13}$.1$^{3,6}$]pentadecanylene ethylene),
poly(4-methyl-5-perfluoro-isopropoxy-10,12-pentacyclo[6.5.1.0$^{2,7}$.0$^{9,13}$.1$^{3,6}$]pentadecanylene ethylene),
poly(4,5-difluoro-4,5-bis(trifluoromethoxy)-10,12-pentacyclo[6.5.1.0$^{2,7}$.0$^{9,13}$.1$^{3,6}$]pentadecanylene ethylene),
poly(4-perfluorobutoxy-10,12-pentacyclo[6.5.1.0$^{2,7}$.0$^{9,13}$.1$^{3,6}$]pentadecanylene ethylene),
poly(4-perfluoro-isobutoxy-10,12-pentacyclo[6.5.1.0$^{2,7}$.0$^{9,13}$.1$^{3,6}$]pentadecanylene ethylene),
poly(4-perfluoro-tert-10,12-pentacyclo[6.5.1.0$^{2,7}$.0$^{9,13}$.1$^{3,6}$]pentadecanylene ethylene),
poly(4-methyl-5-perfluoro-isobutoxy-10,12-pentacyclo[6.5.1.0$^{2,7}$.0$^{9,13}$.1$^{3,6}$]pentadecanylene ethylene),
poly(4-butyl-5-perfluoro-isobutoxy-10,12-pentacyclo[6.5.1.0$^{2,7}$.0$^{9,13}$.1$^{3,6}$]pentadecanylene ethylene),
poly(4,5-difluoro-4-trifluoromethoxy-5-perfluoroethoxy-10,12-pentacyclo[6.5.1.0$^{2,7}$.0$^{9,13}$.1$^{3,6}$]pentadecanylene ethylene),
poly(4,4,5-trifluoro-5-perfluorobutoxy-10,12-pentacyclo[6.5.1.0$^{2,7}$0$^{9,13}$.1$^{3,6}$]pentadecanylene ethylene),
poly(4,5-difluoro-4-trifluoromethoxy-5-perfluorobutoxy-10,12-pentacyclo[6.5.1.0$^{2,7}$.0$^{9,13}$.1$^{3,6}$]pentadecanylene ethylene),
poly(4-fluoro-4-perfluoroethoxy-5,5-bis(trifluoromethoxy)-10,12-pentacyclo[6.5.1.0$^{2,7}$.0$^{9,13}$.1$^{3,6}$]pentadecanylene ethylene), poly(4,5-difluoro-4-perfluoropropoxy-5-trifluoromethoxy)-10,12-pentacyclo[6.5.1.0$^{2,7}$.0$^{9,13}$.1$^{3,6}$]pentadecanylene ethylene),
poly(4-perfluorohethoxy-10,12-pentacyclo[6.5.1.0$^{2,7}$.0$^{9,13}$.1$^{3,6}$]pentadecanylene ethylene),
poly(4-methyl-5-perfluorohethoxy-10,12-pentacyclo[6.5.1.0$^{2,7}$.0$^{9,13}$.1$^{3,6}$]pentadecanylene ethylene),
poly(4-butyl-5-perfluorohethoxy-10,12-pentacyclo[6.5.1.0$^{2,7}$.0$^{9,13}$.1$^{3,6}$]pentadecanylene ethylene),
poly(4-hexyl-5-perfluorohethoxy-10,12-pentacyclo[6.5.1.0$^{2,7}$.0$^{9,13}$.1$^{3,6}$]pentadecanylene ethylene),
poly(4-octyl-5-perfluorohethoxy-10,12-pentacyclo[6.5.1.0$^{2,7}$.0$^{9,13}$.1$^{3,6}$]pentadecanylene ethylene),
poly(4-perfluoroheptoxy-10,12-pentacyclo[6.5.1.0$^{2,7}$.0$^{9,13}$.1$^{3,6}$]pentadecanylene ethylene),
poly(4-perfluorooctoxy-10,12-pentacyclo[6.5.1.0$^{2,7}$.0$^{9,13}$.1$^{3,6}$]pentadecanylene ethylene),
poly(4-perfluorodethoxy-10,12-pentacyclo[6.5.1.0$^{2,7}$.0$^{9,13}$.1$^{3,6}$]pentadecanylene ethylene),
poly(4,4,5-trifluoroperfluoropentoxy-10,12-pentacyclo[6.5.1.0$^{2,7}$.0$^{9,13}$.1$^{3,6}$]pentadecanylene ethylene),
poly(4,5-difluoro-4-trifluoromethoxy-5-perfluorobutoxy-10,12-pentacyclo[6.5.1.0$^{2,7}$.0$^{9,13}$.1$^{3,6}$]pentadecanylene ethylene),
poly(4,4,5-trifluoro-5-perfluorohethoxy-10,12-pentacyclo[6.5.1.0$^{2,7}$.0$^{9,13}$.1$^{3,6}$]pentadecanylene ethylene),
poly(4,5-difluoro-4-trifluoromethoxy-5-perfluoropentyl-10,12-pentacyclo[6.5.1.0$^{2,7}$.0$^{9,13}$.1$^{3,6}$]pentadecanylene ethylene),
poly(4,5-bis(perfluorobutoxy)-10,12-pentacyclo[6.5.1.0$^{2,7}$.0$^{9,13}$.1$^{3,6}$]pentadecanylene ethylene),
poly(4,5-bis(perfluorohethoxy)-10,12-pentacyclo[6.5.1.0$^{2,7}$.0$^{9,13}$.1$^{3,6}$]pentadecanylene ethylene),
poly(4-methoxy-5-trifluoromethoxy-10,12-pentacyclo[6.5.1.0$^{2,7}$.0$^{9,13}$.1$^{3,6}$]pentadecanylene ethylene),
poly(4-tert-butoxymethyl-5-trifluoromethoxy-10,12-pentacyclo[6.5.1.0$^{2,7}$.0$^{9,13}$.1$^{3,6}$]pentadecanylene ethylene),
poly(4-(2',2',2'-trifluoroethoxy)-10,12-pentacyclo[6.5.1.0$^{2,7}$.0$^{9,13}$.1$^{3,6}$]pentadecanylene ethylene),
poly(4-(2',2',3',3',3'-pentafluoropropoxy)-10,12-pentacyclo[6.5.1.0$^{2,7}$.0$^{9,13}$.1$^{3,6}$]pentadecanylene ethylene),
poly(4-methyl-5-(2',2',3',3',3'-pentafluoropropoxy)-10,12-pentacyclo[6.5.1.0$^{2,7}$.0$^{9,13}$.1$^{3,6}$]pentadecanylene ethylene),
poly(4-butyl-5-(2',2',3',3',3'-pentafluoropropoxy)-10,12-pentacyclo[6.5.1.0$^{2,7}$.0$^{9,13}$.1$^{3,6}$]pentadecanylene ethylene),
poly(4-(1',1',1'-trifluoro-isopropoxy)-10,12-pentacyclo[6.5.1.0$^{2,7}$.0$^{9,13}$.1$^{3,6}$]pentadecanylene ethylene),
poly(4-methyl-(1',1',1'-trifluoro-isopropoxy)-10,12-pentacyclo[6.5.1.0$^{2,7}$.0$^{9,13}$.1$^{3,6}$]pentadecanylene ethylene),
poly(4-(2',2',3',3',4',4',4'-heptafluorobutoxy)-10,12-pentacyclo[6.5.1.0$^{2,7}$.0$^{9,13}$.1$^{3,6}$]pentadecanylene ethylene),
poly(4-(1',1',1'-trifluoro-isobutoxy)-10,12-pentacyclo[6.5.1.0$^{2,7}$.0$^{9,13}$.1$^{3,6}$]pentadecanylene ethylene),
poly(4-(1',1',1'-trifluoro-isobutoxy)-10,12-pentacyclo[6.5.1.0$^{2,7}$.0$^{9,13}$.1$^{3,6}$]pentadecanylene ethylene),
poly(4-methyl-5-(1',1',1'-trifluoro-isobutoxy)-10,12-pentacyclo[6.5.1.0$^{2,7}$.0$^{9,13}$.1$^{3,6}$]pentadecanylene ethylene),
poly(4-butyl-5-(1',1',1'-trifluoro-isobutoxy)-10,12-pentacyclo[6.5.1.0$^{2,7}$.0$^{9,13}$.1$^{3,6}$]pentadecanylene ethylene),
poly(4,5-difluoro-4-trifluoromethoxy-5-(2',2',2'-trifluoroethoxy)-10,12-pentacyclo[6.5.1.0$^{2,7}$.0$^{9,13}$.1$^{3,6}$]pentadecanylene ethylene),
poly(4,4,5-trifluoro-5-(2',2',3',3',4',4',4'-heptafluorobutoxy)-10,12-pentacyclo[6.5.1.0$^{2,7}$.0$^{9,13}$.1$^{3,6}$]pentadecanylene ethylene),
poly(4,5-difluoro-4-trifluoromethoxy-4-(2',2',3',3',4',4',4'-heptafluorobutoxy)-10,12-pentacyclo[6.5.1.0$^{2,7}$.0$^{9,13}$.1$^{3,6}$]pentadecanylene ethylene),
poly(4-fluoro-4-(2',2',2'-trifluoroethoxy)-5,5-bis(trifluoromethoxy)-10,12-pentacyclo[6.5.1.0$^{2,7}$.0$^{9,13}$.1$^{3,6}$]pentadecanylene ethylene),
poly(4,5-difluoro-4-(2',2',3',3',3'-pentafluoropropoxy)-5-trifluoromethoxy-10,12-pentacyclo[6.5.1.0$^{2,7}$.0$^{9,13}$.1$^{3,6}$]pentadecanylene ethylene),
poly(4-(2',2',3',3',4',4',5',5',6',6',6'-undecafluorohethoxy)-10,12-pentacyclo[6.5.1.0$^{2,7}$.0$^{9,13}$.1$^{3,6}$]pentadecanylene ethylene),
poly(4-methyl-5-(2',2',3',3',4',4',5',5',6',6',6'-undecafluorohethoxy)-10,12-pentacyclo[6.5.1.0$^{2,7}$.0$^{9,13}$.1$^{3,6}$]pentadecanylene ethylene),
poly(4-butyl-5-(2',2',3',3',4',4',5',5',6',6',6'-undecafluorohethoxy)-10,12-pentacyclo[6.5.1.0$^{2,7}$.0$^{9,13}$.1$^{3,6}$]pentadecanylene ethylene),
poly(4-hexyl-5-(2',2',3',3',4',4',5',5',6',6',6'-undecafluorohethoxy)-10,12-pentacyclo[6.5.1.0$^{2,7}$.0$^{9,13}$.1$^{3,6}$]pentadecanylene ethylene),
poly(4-octyl-5-(2',2',3',3',4',4',5',5',6',6',6'-undecafluorohethoxy)-10,12-pentacyclo[6.5.1.0$^{2,7}$.0$^{9,13}$.1$^{3,6}$]pentadecanylene ethylene),
poly(4-(2',2',3',3',4',4',5',5',6',6',7',7',7'-tridecafluoroheptoxy)-10,12-pentacyclo[6.5.1.0$^{2,7}$.0$^{9,13}$.1$^{3,6}$]pentadecanylene ethylene),
poly(4-(2',2',3',3',4',4',5',5',6',6',7',7',8',8',8'-pentadecafluorooctoxy)-10,12-pentacyclo[6.5.1.0$^{2,7}$.0$^{9,13}$.1$^{3,6}$]pentadecanylene ethylene),
poly(4-(2',2',3',3',4',4',5',5',6',6',7',7',8',8',9',9',9'-heptadecafluorodethoxy)-10,12-pentacyclo[6.5.1.0$^{2,7}$.0$^{9,13}$.1$^{3,6}$]pentadecanylene ethylene),
poly(4,4,5-trifluoro-5-(1',1',1'-trifluoro-isopropoxy)-10,12-pentacyclo[6.5.1.0$^{2,7}$.0$^{9,13}$.1$^{3,6}$]pentadecanylene ethylene),
poly(4,5-difluoro-4-trifluoromethoxy-5-(2',2',3',3',4',4',4'-heptafluorobutoxy)-10,12-pentacyclo[6.5.1.0$^{2,7}$.0$^{9,13}$.1$^{3,6}$]pentadecanylene ethylene),
poly(4,4,5-trifluoro-(2',2',3',3',4',4',5',5',6',6',6'-undecafluorohethoxy)-10,12-pentacyclo[6.5.1.0$^{2,7}$.0$^{9,13}$.1$^{3,6}$]pentadecanylene ethylene),
poly(4,5-bis(2',2',3',3',4',4',4'-heptafluorobutoxy)-10,12-pentacyclo[6.5.1.0$^{2,7}$.0$^{9,13}$.1$^{3,6}$]pentadecanylene ethylene), and
poly(4,5-bis(2',2',3',3',4',4',5',5',6',6',6'-undecafluorohethoxy)-10,12-pentacyclo[6.5.1.0$^{2,7}$.0$^{9,13}$.1$^{3,6}$]pentadecanylene ethylene).

The polymer may also include other repeating structural units in addition to the repeating structural units represented by the formula (1) and the formula (2), in an amount that gives a fluorine atom content rate in the range of 40% to 75% by mass, to the extent that the effect of the present invention is not impaired, but the content of the repeating structural unit of the formula (1) or the content of the repeating structural units of the formula (1) and the formula (2) is usually 30% to 100% by mass, preferably 70% to 100% by mass, and more preferably 90% to 100% by mass.

Furthermore, in the present invention, the fluorine-containing cyclic olefin polymer containing the repeating structural unit represented by the formula (1) preferably has a region in which the storage modulus or loss modulus obtainable by dynamic mechanical analysis by tensile mode (frequency 1 Hz, rate of temperature increase 3° C./min) varies in the range of −1 MPa/° C. to 0 MPa/° C. with respect to the changes in temperature in a range of temperature which is not less than the glass transition temperature. The characteristics are based on the hydrogen bonding formed between the molecules or within the molecule of the polymer having a hydrocarbon structure in the main chain of the repeating structural unit, and having a substituent selected from fluorine, an alkyl containing fluorine, a fluorine-containing C1-C10 alkoxy, and a fluorine-containing C2-C10 alkoxyalkyl, for the at least one of $R^1$ to $R^4$ in a side chain, but are not based on the crosslinking caused by crystallinity or chemical bonding. The hydrogen bonding exhibited by this specific structure causes the polymer to have a flat region in which the variation in the storage modulus or loss modulus with respect to the changes in temperature in a range of temperature which is not less than the glass transition temperature, is $-1$ MPa/° C. to 0 MPa/° C. More preferably, such variation is $-0.5$ MPa/° C. to 0 MPa/° C., and more preferably $-0.2$ MPa/° C. to 0 MPa/° C.

Furthermore, in the present invention, the fluorine-containing cyclic olefin copolymer containing the repeating structural unit [A] represented by the formula (1) and the repeating structural unit [B] represented by the formula (2) has a molar ratio of the structural unit [A] and the structural unit [B] of [A]/[B]=95/5 to 25/75. The structural unit [A] does not include the repeating structural unit represented by the formula (2).

As described above, the variation in the storage modulus or loss modulus has a flat region, and this is because when the polymer has a hydrocarbon structure in the main chain within the repeating structural units and has a substituent selected from fluorine, an alkyl containing fluorine, a fluorine-containing C1-C10 alkoxy, and a fluorine-containing C2-C10 alkoxyalkyl, for at least one of $R^1$ to $R^4$ and at least one of $R^5$ to $R^8$ in a side chain, hydrogen bonding is formed between the molecules or within the molecule of the polymer. By the hydrogen bonding exhibited by this specific structure, the polymer has a flat region in which the variation in the storage modulus or loss modulus with respect to the changes in temperature in a region of temperature which is not less than the glass transition temperature is $-1$ MPa/° C. to 0 MPa/° C. When this molar ratio exceeds 25/75, the flat region in the variation of the storage modulus or loss modulus is lost, and the effect caused by hydrogen bonding is not obtained.

The fluorine-containing cyclic olefin polymer and the fluorine-containing cyclic olefin copolymer of the present invention are amorphous transparent polymers.

In general, amorphous thermoplastic polymers have a rapidly decreased elastic modulus in the region of temperature which is not less than the glass transition temperature when such hydrogen bonding or chemical crosslinking is not present. Thus, the variation in the storage modulus or loss modulus with respect to the changes in temperature exhibits at least $-10$ MPa/° C. or less. On the other hand, the excellent characteristics described above of the fluorine-containing cyclic olefin polymer of the present invention derived from the interaction of the physical hydrogen bonding that is reversible with respect to changes in temperature.

Furthermore, the fluorine-containing cyclic olefin polymer containing the repeating structural unit represented by the formula (1) or the fluorine-containing cyclic olefin copolymer containing the repeating structural units represented by the formula (1) and the formula (2) according to the present invention preferably has the flat variation region of storage modulus or loss modulus described above with respect to the region of temperature which is not less than the glass transition temperature in dynamic mechanical analysis by tensile mode (frequency 1 Hz, rate of temperature increase 3° C./min), in the region of storage modulus or loss modulus of 0.1 MPa or more, more preferably of 0.1 MPa to 10000 MPa, and even more preferably 0.1 MPa to 1000 MPa. When the value is 0.1 MPa or more, the shape can be maintained during the heating and cooling processes of the production process for an imprint product, the change in shrinkage during cooling is small, and the dimensional accuracy of transcription is increased.

Thereby, when the variation in the elastic modulus and shrinkage ratio during the heating and cooling processes during the production of nanoimprint films through solution application, heating and drying or heat press, is suppressed to a minimal level and optimized, production of a film which is capable of forming an imprint product having a fine pattern transcribed from the surface with high dimensional accuracy, and which attains small surface tension and excellent releasability from the mold by containing fluorine, can be realized. Particularly, a nanoimprint method based on solution application, heating and drying gives a high degree of freedom in the film thickness, and is suitable for the production of a film for imprint products with large areas.

The glass transition temperature according to the present invention is the maximum value of the loss modulus/storage modulus (=tan δ) obtainable by measuring the dynamic changes while the temperature of a sample is constantly increased or decreased, and a changing point obtainable by measuring the endothermic or exothermic process in a differential scanning calorimetric analysis.

The glass transition temperature is usually in the range of 30° C. to 250° C., preferably 50° C. to 200° C., and more preferably 60° C. to 160° C. When the glass transition temperature is 30° C. or higher, it is easy to maintain the shape of the imprint product in which the pattern shape formed after the release from a mold is highly accurate. Furthermore, when the glass transition temperature is 250° C. or lower, the heating treatment temperature for melt fluidization can be lowered, and therefore, yellowing or deterioration of the support hardly occurs.

According to the present invention, the fluorine atom content rate in the fluorine-containing cyclic olefin polymer containing a repeated structural unit represented by the formula (1) and the fluorine-containing cyclic olefin copolymer containing the repeating structural units represented by the formula (1) and formula (2) can be determined by the following expression (1):

$$\text{Content of fluorine atoms(mass \%)} = (Fn \times 19) \times 100 / Fw \quad (1)$$

Here, in the expression (1), Fn represents the number of fluorine atoms determined in consideration of the molar proportion in the structural unit represented by the formula (1) and the repeating structural unit represented by the formula (2), and Fw represents the formula weight determined in consideration of the molar proportion in the repeating structural unit represented by the formula (1) and the repeating structural unit represented by the formula (2). Thus, this fluorine atom content rate is 40% to 75% by mass, and preferably 42% to 68% by mass. If this fluorine atom content rate is less than 40% by mass, the flat region of variation of the storage modulus or loss modulus is either small or absent, and the effect of hydrogen bonding is not exhibited. Furthermore, if the fluorine atom content rate exceeds 75% by mass, the number of hydrogen atoms within the structural units is small, and similarly, the effect of hydrogen bonding is not exhibited.

The fluorine-containing cyclic olefin polymer or fluorine-containing cyclic olefin copolymer according to the present invention is such that the weight average molecular weight (Mw) measured by gel permeation chromatography (GPC) relative to polystyrene standards at a sample concentration of 3.0 mg/ml to 9.0 mg/ml is usually 5,000 to 1,000,000, and preferably 10,000 to 300,000. When this weight average molecular weight (Mw) is 5,000 or more, physical properties having a region in which the variation in the storage modulus or loss modulus with respect to the temperature change is −1 MPa/° C. to 0 MPa/° C., can be expressed.

Furthermore, when the weight average molecular weight is 1,000,000 or less, solvent solubility or fluidity at the time of heat press molding is satisfactory. The molecular weight distribution (Mw/Mn) which is the ratio of weight average molecular weight (Mw) and number average molecular weight (Mn), is usually in the range of 1.0 to 5.0.

For example, in order to form a coating film having a uniform thickness or to obtain satisfactory heating moldability, the molecular weight distribution is preferably broad, and is preferably 1.4 to 5.0, and more preferably 1.5 to 3.0.

The fluorine-containing cyclic olefin polymer according to the present invention can have a very low refractive index for the D line, by having the specific structures represented by the formula (1) and the formula (2).

The refractive index for light having the D-line wavelength is usually 1.48 or less, and preferably 1.30 to 1.48, and within this refractive index range, light exhibits excellent straightness. Therefore, the light transmittance in the visible light region is preferably 80% or higher, and more preferably 85% to 100%.

The fluorine-containing cyclic olefin polymer or fluorine-containing cyclic olefin copolymer of the present invention is such that the mass reduction when heated at 300° C. for 5 minutes is usually less than 0.1%, and preferably less than 0.07%, and since the polymer or copolymer is thermoplastic and is excellent in thermal stability, the polymer or copolymer can be treated by heat press molding.

The fluorine-containing cyclic olefin polymer according to the present invention can be synthesized by polymerizing a fluorine-containing cyclic olefin monomer represented by formula (3) by using a ring-opening metathesis polymerization catalyst, and hydrogenating the olefin moiety of the main chain of the resulting polymer.

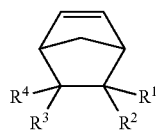

(3)

wherein in the formula (3), at least one of $R^1$ to $R^4$ represents fluorine, a fluorine-containing C1-C10 alkyl, a fluorine-containing C1-C10 alkoxy, or a fluorine-containing C2-C10 alkoxyalkyl; when $R^1$ to $R^4$ represent groups containing no fluorine, $R^1$ to $R^4$ are each selected from hydrogen, a C1-C10 alkyl, a C1-C10 alkoxy, and a C2-C10 alkoxyalkyl; $R^1$ to $R^4$ may be identical with or different from each other; and $R^1$ to $R^4$ may be joined together to form a cyclic structure.

More particularly, examples of $R^1$ to $R^4$ in the formula (3) include fluorine; a fluorine-containing C1-C10 alkyl such as an alkyl obtained by substituting a part or all of the hydrogen atoms of an alkyl group with fluorine such as fluoromethyl, difluoromethyl, trifluoromethyl, trifluoroethyl, pentafluoroethyl, heptafluoropropyl, hexafluoroisopropyl, heptafluoroisopropyl, hexafluoro-2-methylisopropyl, perfluoro-2-methylisopropyl, n-perfluorobutyl, n-perfluoropentyl, and perfluorocyclopentyl; a fluorine-containing C1-C10 alkoxy such as an alkoxy obtained by substituting a part or all of the hydrogen atoms of an alkoxy group with fluorine atoms such as fluoromethoxy, difluoromethoxy, trifluoromethoxy, trifluoroethoxy, pentafluoroethoxy, heptafluoropropoxy, hexafluoroisopropoxy, heptafluoroisopropoxy, hexafluoro-2-methylisopropoxy, perfluoro-2-methylisopropoxy, n-perfluorobutoxy, n-perfluoropentoxy, or perfluorocyclopentoxy; and a fluorine-containing C2-C10 alkoxyalkyl such as an alkoxyalkyl obtained by substituting a part or all of the hydrogen atoms of an alkoxy group with fluorine such as fluoromethoxymethyl, difluoromethoxymethyl, trifluoromethoxymethyl, trifluoroethoxymethyl, pentafluoroethoxymethyl, heptafluoropropoxymethyl, hexafluoroisopropoxymethyl, heptafluoroisopropoxymethyl, hexafluoro-2-methylisopropoxymethyl, perfluoro-2-methylisopropoxymethyl, n-perfluorobutoxymethyl, n-perfluoropentoxymethyl, or perfluorocyclopentoxymethyl.

Furthermore, $R^1$ to $R^4$ may be joined together to form a cyclic structure, and may form a ring such as perfluorocycloalkyl, or perfluorocycloether interrupted with oxygen.

Examples of the other $R^1$ to $R^4$ that do not contain fluorine include hydrogen; a C1-C10 alkyl such as methyl, ethyl, propyl, isopropyl, 2-methylisopropyl, n-butyl, n-pentyl, or cyclopentyl; a C1-C10 alkoxy such as methoxy, ethoxy, propoxy, butoxy, or pentoxy; and a C2-C10 alkoxyalkyl such as methoxymethyl, ethoxymethyl, propoxymethyl, butoxymethyl, or pentoxymethyl.

Furthermore, the monomer used in the production of the fluorine-containing cyclic olefin polymer according to the present invention may be the only fluorine-containing cyclic olefin monomer represented by the formula (3), or may be composed of two or more kinds of structural units which differ from each other in terms of at least one of $R^1$ to $R^4$.

The monomer used in the production of the fluorine-containing cyclic olefin copolymer according to the present invention may be copolymerized with a fluorine-containing cyclic olefin comonomer represented by formula (4):

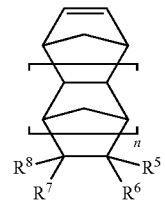

(4)

wherein in the formula (4), at least one of $R^5$ to $R^8$ represents fluorine, a fluorine-containing C1-C10 alkyl, a fluorine-containing C1-C10 alkoxy, or a fluorine-containing C2-C10 alkoxyalkyl; when $R^5$ to $R^8$ represent groups containing no fluorine, $R^5$ to $R^8$ are each selected from hydrogen, a C1-C10 alkyl, a C1-C10 alkoxy, and a C2-C10 alkoxyalkyl; $R^5$ to $R^8$ may be identical with or different from each other; $R^5$ to $R^8$ may be joined together to form a cyclic structure; and n represents an integer of 1 or 2.

More particularly, examples of $R^5$ to $R^8$ in the formula (4) include fluorine; a fluorine-containing C1-C10 alkyl such as an alkyl obtained by substituting a part or all of the hydrogen atoms of an alkyl group with fluorine such as fluoromethyl, difluoromethyl, trifluoromethyl, trifluoroethyl, pentafluoroethyl, heptafluoropropyl, hexafluoroisopropyl, heptafluoroisopropyl, hexafluoro-2-methylisopropyl, perfluoro-2-methylisopropyl, n-perfluorobutyl, n-perfluoropentyl, and perfluorocyclopentyl; a fluorine-containing C1-C10 alkoxy such as an alkoxy obtained by substituting a part or all of the hydrogen atoms of an alkoxy group with fluorine atoms such as fluoromethoxy, difluoromethoxy, trifluoromethoxy, trifluoroethoxy, pentafluoroethoxy, heptafluoropropoxy, hexafluoroisopropoxy, heptafluoroisopropoxy, hexafluoro-2-methylisopropoxy, perfluoro-2-methylisopropoxy, n-perfluorobutoxy, n-perfluoropentoxy, or perfluorocyclopentoxy; and a fluorine-containing C2-C10 alkoxyalkyl such as an alkoxyalkyl obtained by substituting a part or all of the hydrogen atoms of an alkoxy group with fluorine such as fluoromethoxymethyl, difluoromethoxymethyl, trifluoromethoxymethyl, trifluoroethoxymethyl, pentafluoroethoxymethyl, heptafluoropropoxymethyl, hexafluoroisopropoxymethyl, heptafluoroisopropoxymethyl, hexafluoro-2-methylisopropoxymethyl, perfluoro-2-methylisopropoxymethyl, n-perfluorobutoxymethyl, n-perfluoropentoxymethyl, or perfluorocyclopentoxymethyl.

Furthermore, $R^5$ to $R^8$ may be joined together to form a cyclic structure, and may form a ring such as perfluorocycloalkyl, or perfluorocycloether interrupted with oxygen.

Examples of the other $R^5$ to $R^8$ that do not contain fluorine include hydrogen; a C1-C10 alkyl such as methyl, ethyl, propyl, isopropyl, 2-methyl isopropyl, n-butyl, n-pentyl, or cyclopentyl; a C1-C10 alkoxy such as methoxy, ethoxy, propoxy, butoxy, or pentoxy; and a C2-C10 alkoxyalkyl such as methoxymethyl, ethoxymethyl, propoxymethyl, butoxymethyl, or pentoxymethyl.

The monomer used in the production of the fluorine-containing cyclic olefin copolymer according to the present invention may be the fluorine-containing cyclic olefin monomer represented by the formula (4) only, or may be composed of two or more kinds of structural units which differ from each other in terms of at least one of $R^5$ to $R^8$.

The ring-opening metathesis polymerization catalyst that is used in the polymerization of the fluorine-containing cyclic olefin monomer, is not limited as long as it is a catalyst capable of performing ring-opening metathesis polymerization, but examples include tungsten-based alkylidene catalysts such as $W(N-2,6-Pr^i{}_2C_6H_3)(CHBu^t)(OBu^t)_2$, $W(N-2,6-Pr^i{}_2C_6H_3)(CHBu^t)(OCMe_2CF_3)_2$, $W(N-2,6-Pr^i{}_2C_6H_3)(CHBu^t)(OCMe(CF_3)_2)_2$, $W(N-2,6-Pr^i{}_2C_6H_3)(CHBu^t)(OC(CF_3)_3)_2$, $W(N-2,6-(Me))_2C_6H_3)(CHBu^t)(OC(CF_3)_3)_2$, $W(N-2,6-Pr^i{}_2C_6H_3)(CHCMe_2Ph)(OBu^t)_2$, $W(N-2,6-Pr^i{}_2C_6H_3)(CHCMe_2Ph)(OCMe_2CF_3)_2$, $W(N-2,6-Pr^i{}_2C_6H_3)(CHCMe_2Ph)(OCMe\ (CF_3)_2)_2$, $W(N-2,6-Pr^i{}_2C_6H_3)(CHCMe_2Ph)(OC(CF_3)_3)_2$, $W(N-2,6-Me_2C_6H_3)(CHCMe_2Ph)(OC(CF_3)_3)_2$, or $W(N-2,6-Me_2C_6H_3)(CHCHCMePh)(OBu^t)_2\ (PR_3)$, $W(N-2,6-Me_2C_6H_3)(CHCHCMe_2)(OBu^t)_2(PR_3)$, $W(N-2,6-Me_2C_6H_3)(CHCHCPh_2)(OBu^t)_2(PR_3)$, $W(N-2,6-Me_2C_6H_3)(CHCHCMePh)(OCMe_2(CF_3))_2(PR_3)$, $W(N-2,6-Me_2C_6H_3)(CHCHCMe_2)(OCMe_2(CF_3))_2(PR_3)$, $W(N-2,6-Me_2C_6H_3)(CHCHCPh_2)(OCMe_2(CF_3))_2(PR_3)$, $W(N-2,6-Me_2C_6H_3)(CHCHCMePh)(OCMe\ (CF_3)_2)_2(PR_3)$, $W(N-2,6-Me_2C_6H_3)(CHCHCMe_2)(OCMe(CF_3)_2)_2(PR_3)$, $W(N-2,6-Me_2C_6H_3)(CHCHCPh_2)(OCMe\ (CF_3)_2)_2(PR_3)$, $W(N-2,6-Me_2C_6H_3)(CHCHCMePh)(OC(CF_3)_3)_2(PR_3)$, $W(N-2,6-Me_2C_6H_3)(CHCHCMe_2)(OC(CF_3)_3)_2(PR_3)$, $W(N-2,6-Pr^i{}_2C_6H_3)(CHCHCPh_2)(OC(CF_3)_3)_2(PR_3)$, $W(N-2,6-Pr^i{}_2C_6H_3)(CHCHCMePh)(OCMe_2(CF_3))_2(PR_3)$, $W(N-2,6-Pr^i{}_2C_6H_3)(CHCHCMePh)(OCMe(CF_3)_2)_2(PR_3)$, $W(N-2,6-Pr^i{}_2C_6H_3)(CHCHCMePh)(OC(CF_3)_3)_2(PR_3)$, $W(N-2,6-Pr^i{}_2C_6H_3)(CHCHCMePh)(OPh)_2(PR_3)$, or $W(N-2,6-Me_2C_6H_3)(CHCHCMePh)(OBu^t)_2(Py)$, $W(N-2,6-Me_2C_6H_3)(CHCHCMe_2)(OBu^t)_2(Py)$, $W(N-2,6-Me_2C_6H_3)(CHCHCPh_2)(OBu^t)_2(Py)$, $W(N-2,6-Me_2C_6H_3)(CHCHCMePh)(OCMe_2(CF_3))_2(Py)$, $W(N-2,6-Me_2C_6H_3)(CHCHCMe_2)(OCMe_2(CF_3))_2(Py)$, $W(N-2,6-Me_2C_6H_3)(CHCHCPh_2)(OCMe_2(CF_3))_2(Py)$, $W(N-2,6-Me_2C_6H_3)(CHCHCMePh)(OCMe(CF_3)_2)_2(Py)$, $W(N-2,6-Me_2C_6H_3)(CHCHCMe_2)(OCMe(CF_3)_2)_2(Py)$, $W(N-2,6-Me_2C_6H_3)(CHCHCPh_2)(OCMe(CF_3)_2)_2(Py)$, $W(N-2,6-Me_2C_6H_3)(CHCHCMePh)(OC(CF_3)_3)_2(Py)$, $W(N-2,6-Me_2C_6H_3)(CHCHCMe_2)(OC(CF_3)_3)_2(Py)$, $W(N-2,6-Me_2C_6H_3)(CHCHCPh_2)(OC(CF_3)_3)_2(Py)$, $W(N-2,6-Pr^i{}_2C_6H_3)(CHCHCMePh)(OCMe_2(CF_3))_2(Py)$, $W(N-2,6-Pr^i{}_2C_6H_3)(CHCHCMePh)(OCMe(CF_3)_2)_2(Py)$, $W(N-2,6-Pr^i{}_2C_6H_3)(CHCHCMePh)(OC(CF_3)_3)_2(Py)$, and $W(N-2,6-Pr^i{}_2C_6H_3)(CHCHCMePh)(OPh)_2(Py)$; molybdenum-based alkylidene catalysts such as $Mo(N-2,6-Pr^i{}_2C_6H_3)(CHBu^t)(OBu^t)_2$, $Mo(N-2,6-Pr^i{}_2C_6H_3)(CHBu^t)(OCMe_2CF_3)_2$, $Mo(N-2,6-Pr^i{}_2C_6H_3)(CHBu^t)(OCMe(CF_3)_2)_2$, $Mo(N-2,6-Pr^i{}_2C_6H_3)(CHBu^t)(OC(CF_3)_3)_2$, $Mo(N-2,6-Me_2C_6H_3)(CHBu^t)(OC(CF_3)_3)_2$, $Mo(N-2,6-Pr^i{}_2C_6H_3)(CHCMe_2Ph)(OCMe_3)_2$, $Mo(N-2,6-Pr^i{}_2C_6H_3)(CHCMe_2Ph)(OCMe_2(CF_3))_2$, $Mo(N-2,6-Pr^i{}_2C_6H_3)(CHCMe_2Ph)(OCMe\ (CF_3)_2)_2$, $Mo(N-2,6-Pr^i{}_2C_6H_3)(CHCMe_2Ph)(OC(CF_3)_3)_2$, $Mo(N-2,6-Me_2C_6H_3)(CHCMe_2Ph)(OC(CF_3)_3)_2$, $Mo(N-2,6-Pr^i{}_2C_6H_3)(CHCMe_2Ph)(OBu^t)_2(PR_3)$, $Mo(N-2,6-Pr^i{}_2C_6H_3)(CHCMe_2Ph)(OCMe_2CF_3)_2(PR_3)$, $Mo(N-2,6-Pr^i{}_2C_6H_3)(CHCMe_2Ph)(OCMe(CF_3)_2)_2(PR_3)$, $Mo(N-2,6-Pr^i{}_2C_6H_3)(CHCMe_2Ph)(OC(CF_3)_3)_2(PR_3)$, $Mo(N-2,6-Me_2C_6H_3)(CHCMe_2Ph)(OC(CF_3)_3)_2(PR_3)$, $Mo(N-2,6-Pr^i{}_2C_6H_3)(CHCMe_2Ph)(OBu^t)_2(Py)$, $Mo(N-2,6-Pr^i{}_2C_6H_3)(CHCMe_2Ph)(OCMe_2CF_3)_2(Py)$, $Mo(N-2,6-Pr^i{}_2C_6H_3)(CHCMe_2Ph)(OCMe(CF_3)_2)_2(Py)$, $Mo(N-2,6-Pr^i{}_2C_6H_3)(CHCMe_2Ph)(OC(CF_3)_3)_2(Py)$, and $Mo(N-2,6-Me_2C_6H_3)(CHCMe_2Ph)(OC(CF_3)_3)_2(Py)$ (provided that $Pr^i$ in the formulas represents an isopropyl group; R represents an alkyl group such as a methyl group or an ethyl group, or an alkoxy group such as a methoxy group or an ethoxy group; $Bu^t$ represents a tert-butyl group; Me represents a methyl group; Ph represents a phenyl group; and Py represents a pyridine group); and ruthenium-based alkylidene catalysts such as $Ru(CHCHCPh_2)(PPh_3)_2Cl_2$ (provided that Ph in the formula represents a phenyl group), which can be all preferably used. Furthermore, these ring-opening metathesis polymerization catalysts may be used individually or in combination of two or more kinds.

On the other hand, in addition to the ring-opening metathesis polymerization catalysts described above, a ring-opening metathesis polymerization catalyst formed from a combination of an organic transition metal complex, a transition metal halide or a transition metal oxide, and a Lewis acid as a co-catalyst can also be used, but this catalyst has low catalytic activity and is not preferable from an industrial viewpoint.

In regard to the ring-opening metathesis polymerization of the fluorine-containing cyclic olefin monomer, the molar ratio of the fluorine-containing cyclic olefin monomer and the ring-opening metathesis polymerization catalyst is such that in the case of a transition metal alkylidene catalyst of tungsten, molybdenum or ruthenium, the monomer is used in an amount of usually 100 moles to 30,000 moles, and preferably 1,000 moles to 20,000 moles, relative to 1 mole of the transition metal alkylidene catalyst.

Furthermore, an olefin can be used as a chain transfer agent in order to control the molecular weight and the molecular weight distribution. Examples of the olefin include α-olefins such as ethylene, propylene, 1-butene, 1-pentene, 1-hexene, and 1-octene; and fluorine-containing olefins derived from those olefins. Further examples include silicon-containing olefins such as vinyltrimethylsilane, allyltrimethylsilane, allyltriethylsilane, and allyltriisopropylsilane; and fluorine- and silicon-containing olefins derived from those olefins, and still other examples of the dienes include non-conjugated dienes such as 1,4-pentadiene, 1,5-hexadiene, and 1,6-heptadiene; and fluorine-containing non-conjugated dienes derived from those dienes. These olefins, fluorine-containing olefins, dienes and fluorine-containing dienes may be used individually, or two or more kinds may be used together.

The amount of the olefins, fluorine-containing olefins, dienes or fluorine-containing dienes used is such that an olefin or a diene is usually used in an amount in the range of 0.001 moles to 1,000 moles, and preferably 0.01 moles to 100 moles, based on 1 mole of the fluorine-containing cyclic olefin monomer. Furthermore, an olefin or a diene is used in an amount in the range of usually 0.1 moles to 1,000 moles, and preferably 1 mole to 500 moles, based on 1 mole of the transition metal alkylidene catalyst.

The ring-opening metathesis polymerization of the fluorine-containing cyclic olefin monomer may be carried out without solvent or in a solvent, but particularly preferable examples of the solvent that is used include ethers such as tetrahydrofuran, diethyl ether, dibutyl ether, dimethoxyethane, and dioxane; esters such as ethyl acetate, propyl acetate and butyl acetate; aromatic hydrocarbons such as benzene, toluene, xylene and ethylbenzene; aliphatic hydrocarbons such as pentane, hexane and heptane; aliphatic cyclic hydrocarbons such as cyclopentane, cyclohexane, methylcyclohexane, dimethylcyclohexane, and decalin; halogenated hydrocarbons such as methylene dichloride, dichloroethane, dichloroethylene, tetrachloroethane, chlorobenzene, and trichlorobenzene; fluorine-containing aromatic hydrocarbons such as fluorobenzene, difluorobenzene, hexafluorobenzene, trifluoromethylbenzene, and meta-xylene hexafluoride; fluorine-containing aliphatic hydrocarbons such as perfluorohexane; fluorine-containing aliphatic cyclic hydrocarbons such as perfluorocyclodecalin; and fluorine-containing ethers such as perfluoro-2-butyltetrahydrofuran. These may be used in combination of two or more kinds.

In the ring-opening metathesis polymerization of the fluorine-containing cyclic olefin monomer, the concentration of the fluorine-containing cyclic olefin monomer in the monomer solution may vary depending on the reactivity of the monomer and the solubility of the monomer in the polymerization solvent, but the concentration is usually preferably in the range of 5% to 100% by mass, and more preferably 10% to 60% by mass. The reaction temperature is usually in the range of −30° C. to 150° C., and preferably 30° C. to 100° C. The reaction time is usually in the range of 10 minutes to 120 hours, and preferably 30 minutes to 48 hours. Furthermore, a solution of the polymer can be obtained by terminating the reaction with a deactivator such as water, an aldehyde such as butyl aldehyde; a ketone such as acetone; or an alcohol such as methanol.

The fluorine-containing cyclic olefin polymer or fluorine-containing cyclic olefin copolymer of the present invention is obtained by subjecting a fluorine-containing cyclic olefin monomer to ring-opening metathesis polymerization, and subjecting the olefin moiety of the main chain of the resulting polymer to a hydrogenation reaction using a catalyst. The hydrogenation catalyst may be any of a homogeneous metal complex catalyst or a heterogeneous metal-supported catalyst, as long as it is a catalyst capable of hydrogenating the olefin moiety of the main chain of the polymer without causing a hydrogenation reaction of the solvent used. Examples of the homogeneous metal complex catalyst include chlorotris(triphenylphosphine)rhodium, dichlorotris(triphenylphosphine)osmium, dichlorohydridobis(triphenylphosphine)iridium, dichlorotris(triphenylphosphine)ruthenium, dichlorotetrakis(triphenylphosphine)ruthenium, chlorohydridocarbonyltris(triphenylphosphine)ruthenium, and dichlorotris(trimethylphosphine)ruthenium. Examples of the heterogeneous metal-supported catalyst include activated carbon-supported palladium, alumina-supported palladium, activated carbon-supported rhodium, and alumina-supported rhodium. These hydrogenation catalysts can be used individually or in combination of two or more kinds.

When the hydrogenation treatment of the olefin moiety of the main chain is carried out, in the case of using a known heterogeneous or homogeneous hydrogenation catalyst, the amount of the hydrogenation catalyst used is such that the metal component in the hydrogenation catalyst is usually $5 \times 10^{-4}$ parts by mass to 100 parts by mass, and preferably $1 \times 10^{-2}$ parts by mass to 30 parts by mass, relative to 100 parts by mass of the polymer prior to the hydrogenation treatment.

The solvent used in the hydrogenation is not particularly limited as long as the solvent dissolves the fluorine-containing cyclic olefin polymer or fluorine-containing cyclic olefin copolymer, and the solvent itself is not hydrogenated. Examples of the solvent include ethers such as tetrahydrofuran, diethyl ether, dibutyl ether, and dimethoxyethane; esters such as ethyl acetate, propyl acetate and butyl acetate; aromatic hydrocarbons such as benzene, toluene, xylene, and ethylbenzene; aliphatic hydrocarbons such as pentane, hexane, and heptane; aliphatic cyclic hydrocarbons such as cyclopentane, cyclohexane, methylcyclohexane, dimethylcyclohexane, and decalin; halogenated hydrocarbons such as methylene dichloride, chloroform, dichloroethane, dichloroethylene, tetrachloroethane, chlorobenzene, and trichlorobenzene; fluorine-containing aromatic hydrocarbons such as fluorobenzene, difluorobenzene, hexafluorobenzene, trifluoromethylbenzene, and meta-xylene hexafluoride; fluorine-containing aliphatic hydrocarbons such as perfluorohexane; fluorine-containing aliphatic cyclic hydrocarbons such as perfluorocyclodecalin; and fluorine-containing ethers such as perfluoro-2-butyltetrahydrofuran. Combinations of two or more kinds of these solvents may also be used.

The hydrogenation reaction of the olefin moiety of the main chain is carried out at a hydrogen pressure in the range of normal pressure to 30 MPa, preferably 0.5 MPa to 20 MPa, and particularly preferably 2 MPa to 15 MPa, and the reaction temperature is in the temperature range of usually 0° C. to 300° C., preferably room temperature to 250° C., and particularly preferably 50° C. to 200° C. There are no particular limitations on the mode of carrying out the hydrogenation reaction, but examples include a method of performing the reaction with the catalyst dispersed or dissolved in a solvent, and a method of filling the catalyst in a column or the like, and performing the reaction by passing a polymer solution through the column as a static phase.

There are no particular limitations on the hydrogenation treatment of the olefin moiety of the main chain, and the hydrogenation treatment may be carried out after precipitating a polymerization solution of the fluorine-containing cyclic olefin polymer prior to the hydrogenation treatment in a poor solvent, isolating the polymer, and then dissolving the polymer again in a solvent, or the hydrogenation treatment may be carried out using the hydrogenation catalyst described above, without isolating the polymer from the polymerization solution.

Furthermore, the hydrogenation rate of the olefin moiety of the fluorine-containing cyclic olefin polymer is 50% or more, preferably 70% to 100%, and more preferably 90% to 100%. When this hydrogenation rate is less than 50%, the olefin moiety may be deteriorated due to oxidation or light absorption, thereby causing deterioration of heat resistance or weather resistance.

When the polymer solution (resin composition for pattern transfer) according to the present invention is brought into contact with a mold, the fluorine-containing cyclic olefin polymer may be recovered from the polymer solution after hydrogenation, and then the polymer may be dissolved again in a solvent and brought into contact with a mold. Alternatively, the polymer solution obtained after hydrogenation may be directly brought into contact with the mold without recovering the fluorine-containing cyclic olefin polymer, or two or more kinds of solvents may be mixed with the polymer solution after hydrogenation and then, the mixture may be brought into contact with the mold. The method for recovering the fluorine-containing cyclic olefin polymer from the polymer solution after hydrogenation is not particularly limited, but examples include a method of discharging the reaction solution into a poor solvent under stirring; a method of precipitating the polymer by a steam stripping method in which steam is blown into the reaction solution, or the like, and recovering the polymer by filtration, centrifugation, decantation or the like; and a method of evaporating and removing the solvent from the reaction solution through heating or the like. Furthermore, various known additives such as an ultraviolet absorbent, an antioxidant, a flame retardant, and an antistatic agent can also be incorporated into the recovered polymer, to the extent that the purpose of the present invention is not impaired.

As a method of bringing the fluorine-containing cyclic olefin polymer or fluorine-containing cyclic olefin copolymer of the present invention obtained as described, into contact with a mold having a fine pattern formed on the surface, and thereby transcribing the pattern of the mold, there may be mentioned a method of bringing a solution containing the fluorine-containing cyclic olefin polymer and an organic solvent, into contact with a mold, and evaporating the solvent to thereby transcribe the pattern of the mold; or a method of using a film formed of this polymer, and pressing the surface of a mold where a fine pattern is present to thereby transcribe the pattern of the mold.

According to the present invention, since the polymer solution (resin composition for pattern transcription) contains a fluorine-containing cyclic olefin polymer such as described above, an imprint product can be efficiently produced with high dimensional accuracy, and an imprint product with a large area can be produced by simple and convenient processes. Therefore, the resin composition for pattern transcription of the present invention can enhance the production efficiency for the imprint product.

There are no particular limitations on the shape of the convex portions and concave portions of the mold having a fine pattern formed on the surface, which is used in the present invention, but examples of the shape include a tetragonal shape, a cylindrical shape, a prism shape, a pyramidal shape, a polyhedral shape, and a hemispherical shape. Furthermore, examples of the cross-sectional shape of the convex portions and the concave portions include a cross-sectional tetragonal shape, a cross-sectional triangular shape, and a cross-sectional semicircular shape. As specific examples of the fine pattern of the imprint product of the mold, a pattern in which the shape satisfying the conditions described above has a concavo-convex structure, and the like are preferable, but the disposition may be continuous at an equal interval, or may be non-continuous at a non-equal interval, without particular limitations.

The width of the convex portions and/or concave portions of the fine pattern is usually 10 nm to 50 µm, and preferably 20 nm to 1 µm. The depth of the concave portions is usually 30 nm to 50 µm, and preferably 50 nm to 1 µm. The aspect ratio, which is the ratio of the width of the convex portions and the depth of the concave portions, is usually 0.1 to 500, and preferably 0.5 to 20.

Examples of the base material of the mold having a fine pattern formed on the surface, which is used to produce the imprint product of the present invention, include metallic materials such as nickel, iron, stainless steel, germanium, titanium, and silicon; inorganic materials such as glass, quartz, and alumina; resin materials such as polyimide, polyamide, polyester, polycarbonate, polyphenylene ether, polyphenylene sulfide, polyacrylate, polymethacrylate, polyallylate, an epoxy resin, and a silicone resin; and carbonaceous materials such as diamond and graphite.

The imprint product of the present invention can be obtained by bringing a solution containing the fluorine-containing cyclic olefin polymer or fluorine-containing cyclic olefin copolymer and an organic solvent (resin composition for pattern transcription), into contact with a mold, evaporating the solvent, and thereby transcribing the pattern of the mold. The mixing ratio of the polymer and the organic solvent is such that the concentration of the fluorine-containing cyclic olefin polymer in the solution is in the range of usually 5% to 90% by mass, and preferably 10% to 60% by mass, and a concentration which is efficient and suitable for the optimal polymer thickness on the mold after evaporation of the solvent or for coatability and the like, can be selected.

There are no particular limitations on the organic solvent used, but the organic solvent can be selected from, for example, fluorine-containing aromatic hydrocarbons such as meta-xylene hexafluoride, benzotrifluoride, fluorobenzene, difluorobenzene, hexafluorobenzene, trifluoromethylbenzene, bis(trifluoromethyl)benzene, and meta-xylene hexafluoride; fluorine-containing aliphatic hydrocarbons such as perfluorohexane, and perfluorooctane; fluorine-containing aliphatic cyclic hydrocarbons such as perfluorocyclodecalin; fluorine-containing ethers such as perfluoro-2-butyltetrahydrofuran; halogenated hydrocarbons such as chloroform, chlorobenzene, and trichlorobenzene; ethers such as tetrahydrofuran, dibutyl ether, 1,2-dimethoxyethane, and dioxane; esters such as ethyl acetate, propyl acetate, and butyl acetate; and ketones such as methyl isobutyl ketone, and cyclohexanone, while considering solubility and film formability. Among these, the organic solvents may be used individually, or combinations of two or more kinds may be used. Particularly, from the viewpoint of film formability, a solvent having a boiling point of 70° C. or higher at atmospheric pressure is preferable. If the boiling point of the solvent is low, the rate of evaporation is high, and the solvent begins to partially dry during application. Thus, a low boiling point of the solvent causes deterioration of the film thickness accuracy, or fisheyes on the film surface.

The method of bringing a solution of the polymer of the present invention into contact with a mold is not particularly limited, but examples include a method of applying the polymer solution on the finely patterned surface of the mold by a method such as table coating, spin coating, dip coating, die coating, spray coating, bar coating, roll coating, or curtain flow coating; and a method of applying the polymer solution on a substrate made of a metallic material such as stainless steel or silicon; an inorganic material such as glass or quartz; a rein material such as polyimide, polyamide, polyester, polycarbonate, polyphenylene ether, polyphenylene sulfide, polyacrylate, polymethacrylate, polyallylate, an epoxy resin, or a silicone resin, by a method such as table coating, spin coating, dip coating, die coating, spray coating, bar coating, roll coating, or curtain flow coating, and placing the finely patterned surface of the mold on the applied solution to bring them into contact.

Specific examples include:

(1) a method including a step of applying a solution containing the fluorine-containing cyclic olefin polymer or fluorine-containing cyclic olefin copolymer and an organic solvent on the surface of a mold having a fine pattern, and a step of evaporating the organic solvent from the solution; and (2) a method including a step of applying a solution containing the fluorine-containing cyclic olefin polymer or fluorine-containing cyclic olefin copolymer and an organic solvent on a support (substrate), a step of pressing the surface of the coating layer with the surface of a mold where a fine pattern is formed, and a step of evaporating the solvent from the coating layer. In regard to the method of (2), the solvent may be evaporated from the coating layer, and then pressing with the mold can be performed.

The film thickness on the mold from which the solvent has been evaporated after the contact is not particularly limited, but is preferably 1 µm to 10 mm, more preferably 5 µm to 1 mm, and most preferably 10 µm to 0.5 mm. When the thickness is in this range, a self-sustaining imprint product can be obtained.

The temperature at which the solvent is dried by evaporating from the imprint product is usually in the range of 10° C. to 300° C., and preferably 50° C. to 200° C., and the pressure is usually in the range of 133 Pa to atmospheric pressure. The drying time is usually in the range of 10 minutes to 120 hours, and preferably 30 minutes to 48 hours. Furthermore, the drying temperature, pressure and time may be respectively altered to set values in a stepwise manner.

In the present invention, the method includes a step of releasing the imprint product from the mold after forming the imprint product on a mold by evaporating the solvent. Release of the imprint product is preferably carried out at a temperature of the glass transition temperature or lower, and it is more preferable to release the imprint product at a temperature of "glass transition temperature −20° C." or higher. Thereby, the pattern shape formed on the imprint product can be maintained highly accurately, and release can be easily achieved. In regard to the method of release, the imprint product may be released from the mold by peeling, or the imprint product and the mold may be brought into contact by, for example, a method such as immersion with a medium such as water or spraying, and then the imprint product can be peeled off by utilizing the surface tension. Alternatively, a resin material or an inorganic material such as glass may be pasted on the back surface of the imprint product, and the substrate may be released as a support.

Furthermore, the imprint product of the present invention can also be obtained by transcribing the pattern of a mold by pressing the finely patterned surface of the mold on a film containing the fluorine-containing cyclic olefin polymer or fluorine-containing olefin copolymer. For example, a method of pressing the film to the mold which has been heated to a temperature which is not less than the glass transition temperature; a method of heating the film to a temperature which is not less than the glass transition temperature and pressing the mold to the film; or a method of heating the film and the mold to a temperature which is not less than the glass transition temperature, and pressing the mold to the film, is preferable. The heating temperature is in the range of "the glass transition temperature" to "glass transition temperature+100° C.", and preferably "glass transition temperature+5° C." to "glass transition temperature+50° C.". The pressing pressure is usually in the range of 1 MPa to 100 MPa, and preferably 1 MPa to 60 MPa. Thus, the pattern shape formed on the imprint product can be accurately formed.

The release of the imprint product formed on the mold by pressing is preferably carried out at a temperature of the glass transition temperature or lower, and it is more preferable to release the imprint product at a temperature of "glass transition temperature −20°" or lower. Thereby, the pattern shape formed on the imprint product can be maintained highly accurately, and release can be easily achieved. In regard to the method of release, the imprint product may be released from the mold by peeling, or the imprint product and the mold may be brought into contact by, for example, a method such as immersion with a medium such as water or spraying, and then the imprint product can be peeled off by utilizing the surface tension. Alternatively, a resin material or an inorganic material such as glass may be pasted on the back surface of the imprint product, and the substrate may be released as a support.

Furthermore, a cured product having a fine pattern which has been transcribed to the surface of a photocured resin can be produced by bringing the surface having the fine pattern of the imprint product which is comprised of the fluorine-containing cyclic olefin polymer or fluorine-containing cyclic olefin copolymer, into contact with a photocurable monomer composition, irradiating the photocurable monomer composition with light to cure the composition, and then peeling the imprint product.

More particularly, the method may be either a method of using, as a replica mold, an imprint product formed of a fluorine-containing cyclic olefin polymer or a fluorine-containing cyclic olefin copolymer, applying a composition of a curable monomer and a photocuring initiator on the finely patterned surface of this imprint product, irradiating the composition with light, and thereby transcribing the fine pattern to the photocured resin; or a method of applying a composition of a curable monomer and a photocuring initiator on a substrate made of a metallic material such as stainless steel or silicon; an inorganic material such as glass or quartz; a resin material such as polyimide, polyamide, polyester, polycarbonate, polyphenylene ether, polyphenylene sulfide, polyacrylate, polymethacrylate, polyallylate, an epoxy resin or a silicone resin; or the like, placing the finely patterned surface of this imprint product on the composition, irradiating the composition with light from the opposite surface of the patterned surface of the imprint product, and thereby transcribing the pattern to the photocured resin. Since the imprint product of the present invention is formed from a fluorine-containing cyclic olefin polymer and thus has excellent transparency, even if light is irradiated from the opposite surface of the patterned surface of the imprint product, the irradiated light permeates through the imprint product so that the photocured resin can be efficiently irradiated.

There are no particular limitations on the method of bringing the finely patterned surface of the imprint product of a fluorine-containing cyclic olefin polymer as a replica mold, into contact with a curable monomer composition, but for example, the imprint product can be brought into contact with the photocurable monomer composition by applying the photocurable monomer composition on the finely patterned surface of the imprint product by a method such as table coating, spin coating, dip coating, die coating, spray coating, bar coating, roll coating or curtain flow coating, or by applying the curable monomer composition on a substrate made of the metallic material described above, an inorganic material such as glass or quartz, a resin material or the like, by a method such as table coating, spin coating, dip coating, die coating, spray coating, bar coating, roll coating or curtain flow coating, and then placing the finely patterned surface of the imprint product on the curable monomer composition.

The irradiated light is not particularly limited as long as it can provide energy that induces a radical reaction or an ion reaction by irradiating a photocuring initiator with the light. As a light source for this, light rays having a wavelength of 400 nm or less, for example, a low pressure mercury lamp, a middle pressure mercury lamp, a high pressure mercury lamp, an ultrahigh pressure mercury lamp, a chemical lamp, a black light lamp, a microwave-excited mercury lamp, and a metal halide lamp, i-line, G-line, KrF excimer laser light, and ArF excimer laser light can be used.

The irradiation intensity for the photocurable monomer composition is controlled in accordance with the target product, and is not particularly limited. For example, the photoirradiation intensity of light in a wavelength region effective for the activation of the photopolymerization initiator that will be described later (the effective light wavelength region may vary depending on the photopolymerization initiator, but light having a wavelength of 300 nm to 420 nm is usually used) is preferably 0.1 mW/cm$^2$ to 100 mW/cm$^2$. When the irradiation intensity to the composition is less than 0.1 mW/cm$^2$, the reaction time is excessively lengthened. When the irradiation intensity is more than 100 mW/cm$^2$, there is a risk that a decrease in the cohesive force of the resulting cured product, yellowing, or deterioration of the support may occur due to the heat radiated from the lamp and the heat generation occurring during the polymerization of the composition.

The time for irradiation of light is controlled in accordance with the target product and is not particularly limited; however, the integrated amount of light represented by the product of light irradiation intensity and light irradiation time in the light wavelength region can be set to 3 mJ/cm$^2$ to 1000 mJ/cm$^2$. The integrated amount of light is more preferably 5 mJ/cm$^2$ to 500 mJ/cm$^2$, and particularly preferably 10 mJ/cm$^2$ to 300 mJ/cm$^2$. When the integrated amount of light irradiated to the composition is less than 3 mJ/cm$^2$, generation of an active species from the photopolymerization initiator does not occur sufficiently, and there is a risk that a decrease in the characteristics of the resulting cured product may occur. When the integrated amount of light is greater than 1000 mJ/cm$^2$, it is disadvantageous in terms of productivity enhancement. Furthermore, in some occasions, it is also preferable to use heating in combination to accelerate the polymerization reaction. Furthermore, the temperature in the case of curing the curable resin by irradiating light is preferably 0° C. to 150° C., and more preferably 0° C. to 60° C.

The film thickness of the cured resin, which is obtained by curing the curable resin by irradiating light, is not particularly limited, but the thickness is preferably 1 μm to 10 mm, more preferably 5 μm to 1 mm, and most preferably 10 μm to 0.5 mm. When the thickness is in this range, a self-sustaining cured product can be obtained.

Release of the imprint product of the fluorine-containing cyclic olefin polymer or fluorine-containing cyclic olefin copolymer from the cured product may be carried out by peeling from the cured product, or by dissolving the imprint product in an organic solvent. Furthermore, a resin material or an inorganic material such as glass may be pasted on the back surface of the imprint product, and the substrate may be released as a support.

Release by peeling is not particularly limited, but for example, the cured product and the imprint product may be brought into contact with a medium such as water by a method such as immersion or spraying, and then peeling can be carried out by using the surface tension. Release may also be carried out by dissolving the imprint product using an organic solvent. In the case of performing release by dissolving the imprint product, there are no particular limitations on the organic solvent used, but the organic solvent can be selected from fluorine-containing aromatic hydrocarbons such as meta-xylene hexafluoride, benzotrifluoride, fluorobenzene, difluorobenzene, hexafluorobenzene, trifluoromethylbenzene, bis(trifluoromethyl)benzene, and meta-xylene hexafluoride; fluorine-containing aliphatic hydrocarbons such as perfluorohexane, and perfluorooctane; fluorine-containing aliphatic cyclic hydrocarbons such as perfluorocyclodecalin; fluorine-containing ethers such as perfluoro-2-butyltetrahydrofuran; halogenated hydrocarbons such as chloroform, chlorobenzene, and trichlorobenzene; ethers such as tetrahydrofuran, dibutyl ether, 1,2-dimethoxyethane, and dioxane; esters such as ethyl acetate, propyl acetate, and butyl acetate; and ketones such as methyl isobutyl ketone, and cyclohexanone, in consideration of solubility.

Examples of the photocurable monomer of the present invention include a compound having a reactive double bond group, and a resin containing a ring-opening polymerizable compound capable of cation polymerization. These compounds may be may have one reactive group in one molecule, or may have plural reactive groups in one molecule. Examples of the photopolymerization initiator include a photoradical initiator that produces a radical by irradiation of light, and a photocation initiator that produces a cation by irradiation of light.

When a composition is obtained by mixing a photocurable monomer and a photocuring initiator, the amount of the photocuring initiator used is preferably 0.05 parts by mass or more, and more preferably 0.1 parts to 10 parts by mass, relative to 100 parts by mass of the curable monomer.

Specific examples of the curable monomer of a compound having a reactive double bond group include, for example, cyclic olefins such as norbornene and norbornadiene; alkyl vinyl ethers such as cyclohexyl methylvinyl ether, isobutyl vinyl ether, cyclohexyl vinyl ether, and ethyl vinyl ether; vinyl esters such as vinyl acetate; (meth)acrylic acid and derivatives thereof such as (meth)acrylic acid, phenoxyethyl acrylate, benzyl acrylate, stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, dipentaerythritol hexaacrylate, ethoxyethyl acrylate, methoxyethyl acrylate, glycidyl acrylate, tetrahydrofurfuryl acrylate, diethylene glycol diacrylate, neopentyl glycol diacrylate, polyoxyethylene glycol diacrylate, tripropylene glycol diacrylate, 2-hydroxyethyl acrylate, 2-hydroxypropyl acrylate, 4-hydroxybutyl vinyl ether, N,N-diethylaminoethyl acrylate, N,N-dimethylaminoethyl acrylate, N-vinylpyrrolidone, and dimethylaminoethyl methacrylate, or fluorine-containing acrylates thereof; and fluorodienes ($CF_2$=$CFOCF_2CF_2CF$=$CF_2$, $CF_2$=$CFOCF_2CF(CF_3)CF$=$CF_2$, $CF_2$=$CFCF_2C(OH)(CF_3)CH_2CH$=$CH_2$, $CF_2$=$CFCF_2C(OH)(CF_3)CH$=$CH_2$, $CF_2$=$CFCF_2C(CF_3)(OCH_2OCH_3)CH_2CH$=$CH_2$, $CF_2$=$CFCH_2C(C(CF_3)_2OH)(CF_3)CH_2CH$=$CH_2$, and the like). Among these, the monomers may be used individually, or two or more kinds may be used in combination.

Specific examples of the curable monomer of a ring-opening polymerizable compound capable of cation polymerization include, for example, epoxy compounds such as alicyclic epoxy resins or glycidyl ether of hydrogenated bisphenol A, cyclohexene epoxide, dicyclopentadiene oxide, limonene dioxide, 4-vinylcyclohexene dioxide, 3,4-epoxycyclohexylmethyl-3',4'-epoxycyclohexane carboxylate, di(3,4-epoxycyclohexyl)adipate, (3,4-epoxycyclohexyl)methyl alcohol, (3,4-epoxy-6-methylcyclohexyl)methyl-3,4-epoxy-6-methylcyclohexane carboxylate, ethylene 1,2-di(3,4-epoxycyclohexanecarboxylic acid) ester, (3,4-epoxycyclohexyl)ethyltrimethoxysilane, phenyl glycidyl ether, dicyclohexyl-3,3'-diepoxide, bisphenol A type epoxy resins, halogenated bisphenol A type epoxy resins, bisphenol F type epoxy resins, o-, m-, p-cresol novolac type epoxy resins, phenol novolac type epoxy resins, polyglycidyl ethers of polyhydric alcohols, and 3,4-epoxycyclohexenylmethyl-3',4'-epoxycyclohexenecarboxylate; and oxetane compounds such as 3-methyl-3-(butoxymethyl)oxetane, 3-methyl-3-(pentyloxymethyl)oxetane, 3-methyl-3-(hexyloxymethyl)oxetane, 3-methyl-3-(2-ethylhexyloxymethyl)oxetane, 3-methyl-3-(octyloxymethyl)oxetane, 3-methyl-3-(decanoloxymethyl)oxetane, 3-methyl-3-(dodecanoloxymethyl)oxetane, 3-methyl-3-(phenoxymethyl)oxetane, 3-ethyl-3-(butoxymethyl)oxetane, 3-ethyl-3-(pentyloxymethyl)oxetane, 3-ethyl-3-(hexyloxymethyl)oxetane, 3-ethyl-3-(2-ethylhexyloxymethyl)oxetane, 3-ethyl-3-(octyloxymethyl)oxetane, 3-ethyl-3-(decanoloxymethyl)oxetane, 3-ethyl-3-(dodecanoloxymethyl)oxetane, 3-(cyclohexyloxymethyl)oxetane, 3-methyl-3-(cyclohexyloxymethyl)oxetane, 3-ethyl-3-(cyclohexyloxymethyl)oxetane, 3-ethyl-3-(phenoxymethyl)oxetane, 3,3-dimethyloxetane, 3-hydroxymethyloxetane, 3-methyl-3-hydroxymethyloxetane, 3-ethyl-3-hydroxymethyloxetane, 3-ethyl-3-phenoxymethyloxetane, 3-n-propyl-3-hydroxymethyloxetane, 3-isopropyl-3-hydroxymethyloxetane, 3-n-butyl-3-hydroxymethyloxetane, 3-isobutyl-3-hydroxymethyloxetane, 3-sec-butyl-3-hydroxymethyloxetane, 3-tert-butyl-3-hydroxymethyloxetane, and 3-ethyl-3-(2-ethylhexyl)oxetane; and as compounds having two or more oxetanyl groups, bis(3-ethyl-3-oxetanylmethyl)ether, 1,2-bis[(3-ethyl-3-oxetanylmethoxy)]ethane, 1,3-bis[(3-ethyl-3-oxetanylmethoxy)]propane, 1,3-bis[(3-ethyl-3-oxetanylmethoxy)]-2,2-dimethylpropane, 1,4-bis(3-ethyl-3-oxetanylmethoxy)butane, 1,6-bis(3-ethyl-3-oxetanylmethoxy)hexane, 1,4-bis[(3-methyl-3-oxetanyl)methoxy]benzene, 1,3-bis[(3-methyl-3-oxetanyl)methoxy]benzene, 1,4-bis{[(3-methyl-3-oxetanyl)methoxy]methyl}benzene, 1,4-bis{[(3-methyl-3-oxetanyl)methoxy]methyl}cyclohexane, 4,4'-bis{[(3-methyl-3-oxetanyl)methoxy]methyl}biphenyl, 4,4'-bis{[(3-methyl-3-oxetanyl)methoxy]methyl}bicyclohexane, 2,3-bis[(3-methyl-3-oxetanyl)methoxy]bicyclo[2.2.1]heptane, 2,5-bis[(3-methyl-3-oxetanyl)methoxy]bicyclo[2.2.1]heptane, 2,6-bis[(3-methyl-3-oxetanyl)methoxy]bicyclo[2.2.1]heptane, 1,4-bis[(3-ethyl-3-oxetanyl)methoxy]benzene, 1,3-bis[(3-ethyl-3-oxetanyl)methoxy]benzene, 1,4-bis{[(3-ethyl-3-oxetanyl)methoxy]methyl}benzene, 1,4-bis{[(3-ethyl-3-oxetanyl)methoxy]methyl}cyclohexane, 4,4'-bis{[(3-ethyl-3-oxetanyl)methoxy]methyl}biphenyl, 4,4'-bis{[(3-ethyl-3-oxetanyl)methoxy]methyl}bicyclohexane, 2,3-bis[(3-ethyl-3-oxetanyl)methoxy]bicyclo[2.2.1]heptane, 2,5-bis[(3-ethyl-3-oxetanyl)methoxy]bicyclo[2.2.1]heptane, and 2,6-bis[(3-ethyl-3-oxetanyl)methoxy]bicyclo[2.2.1]heptane.

Among these, the compounds may be used individually, or two or more kinds may be used in combination.

Furthermore, examples of the photoradical initiator that produces a radical by irradiation of light include acetophenones such as acetophenone, p-tert-butyltrichloroacetophenone, chloroacetophenone, 2,2-diethoxyacetophenone, hydroxyacetophenone, 2,2-dimethoxy-2'-phenylacetophenone, 2-aminoacetophenone, and dialkylaminoacetophenone; benzoins such as benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropan-1-one, and 1-(4-isopropylphenyl)-2-hydroxy-2-methylpropan-1-one; benzophenones such as benzophenone, benzoylbenzoic acid, methyl benzoylbenzoate, methyl-o-benzoylbenzoate, 4-phenylbenzophenone, hydroxybenzophenone, hydroxypropylbenzophenone, acrylbenzophenone, and 4,4'-bis(dimethylamino)benzophenone; thioxanthones such as thioxanthone, 2-chlorothioxanthone, 2-methylthioxanthone, diethylthioxanthone, and dimethylthioxanthone; fluorine-based peroxides such as perfluoro(tert-butyl peroxide), and perfluorobenzoyl peroxide; α-acyloxime ester, benzyl-(o-ethoxycarbonyl)-α-monoxime, acylphosphine oxide, glyoxyester, 3-ketocoumarin, 2-ethylanthraquinone, camphorquinone, tetramethylthiuram sulfide, azobisisobutyronitrile, benzoyl peroxide, dialkyl peroxide, and tert-butyl peroxypivalate. These photoradical initiators may be used individually, two or more kinds may be used in combination.

The photocation initiator that produces a cation by irradiation of light is not particularly limited as long as it is a compound that initiates cation polymerization of a ring-opening polymerizable compounds capable of cation polymerization, by irradiation of light. However, the photocation initiator is preferably, for example, a compound which undergoes a photoreaction and releases a Lewis acid, such as an onium salt of an onium cation and a pairing anion.

Specific examples of the onium cation include diphenyliodonium, 4-methoxydiphenyliodonium, bis(4-methylphenyl)iodonium, bis(4-tert-butylphenyl)iodonium, bis(dodecylphenyl)iodonium, triphenylsulfonium, diphenyl-4-thiophenoxyphenylsulfonium, bis[4-(diphenylsulfonio)-phenyl]sulfide, bis[4-(di(4-(2-hydroxyethyl)phenyl)sulfonio)-phenyl]sulfide, and η5-2,4-(cyclopentadienyl)[1,2,3,4,5,6-η-(methylethyl)benzene]-iron (1+). In addition to the onium cations, perchlorate ions, trifluoromethanesulfonate ions, toluenesulfonate ions, trinitrotoluene sulfonate ions, and the like may be used.

On the other hand, specific examples of the anion include tetrafluoroborate, hexafluorophosphate, hexafluoroantimonate, hexafluoroarsenate, hexachloroantimonate, tetra(fluorophenyl)borate, tetra(difluorophenyl)borate, tetra(trifluorophenyl)borate, tetra(tetrafluorophenyl)borate, tetra(pentafluorophenyl)borate, tetra(perfluorophenyl)borate, tetra(trifluoromethylphenyl)borate, and tetra(di(trifluoromethyl)phenyl)borate. These photocation initiators may be used individually, or two or more kinds may be used in combination.

Furthermore, in the present invention, other known components may also be added as necessary, in addition to the monomer having a photocurable group and the photopolymerization initiator. Examples of the other components include modifiers such as an aging preventing agent, a leveling agent, a wettability improving agent, a surfactant, and a plasticizer; stabilizers such as an ultraviolet absorbent, an antiseptic agent, and an antibacterial agent; a photosensitizer, a silane coupling agent, and a solvent.

In the present invention, a thermosetting monomer composition can be used instead of the photocurable monomer composition. In the case of using a thermosetting monomer, it is preferable to cure the thermosetting monomer at a temperature of not more than the glass transition temperature of the fluorine-containing cyclic olefin polymer or fluorine-containing cyclic olefin polymer. If the monomer composition is cured at over the glass transition temperature, the fine pattern may be deformed.

EXAMPLES

Hereinafter, the present invention will be described based on the Examples, but the present invention is not intended to be limited to these Examples.

The methods for measuring the property values of the polymers synthesized in the Examples, the nanoimprint molding method, and the methods for observation thereof will be described below.

[Weight Average Molecular Weight (Mw), Molecular Weight Distribution (Mw/Mn)]

The weight average molecular weight (Mw) and number average molecular weight (Mn) of a polymer dissolved in tetrahydrofuran (THF) or trifluoromethyltoluene (TFT) were measured by using gel permeation chromatography (GPC) under the following conditions, under the correction of the molecular weight relative to polystyrene standards.

Detector: RI-2031 and 875-UV manufactured by JASCO Corp., or Model 270 manufactured by Viscotec Corp.; columns connected in series: Shodex K-806M, 804, 803, 802.5; column temperature: 40° C.; flow rate: 1.0 ml/min; sample concentration: 3.0 mg/ml to 9.0 mg/ml

[Hydrogenation Rate of Fluorine-Containing Cyclic Olefin Polymer]

A powder of a ring-opening metathesis polymer which had been subjected to a hydrogenation reaction, was dissolved in deuterated chloroform, deuterated tetrahydrofuran, or a mixed solvent of hexafluorobenzene and deuterated chloroform, and the hydrogenation rate was calculated, using a 270 MHz-$^1$H-NMR spectrum, from the integrated values of the absorption spectrum derived from the hydrogen bonded to the double bond carbons in the main chain at δ=4.5 to 7.0 ppm.

[Composition Ratio of Fluorine-Containing Cyclic Olefin Copolymer]

A powder of a ring-opening metathesis polymer which had been subjected to a hydrogenation reaction, was dissolved in deuterated tetrahydrofuran, or a mixed solvent of hexafluorobenzene and deuterated chloroform, and orthodifluorobenzene was added thereto as a reference substance. The composition ratio was calculated using a 373 MHz-$^{19}$F-NMR spectrum, from the integrated values of the signals originating from —CF at δ=−150 to −200 ppm, —CF$_2$ at δ=−100 to −150 ppm, or —CF$_3$ at δ=−60 to −100 ppm in the respective unit structures of formula (1) and formula (2), with the orthodifluorobenzene at δ=−139 ppm set as the reference signal.

[Fluorine Atom Content Rate]

The fluorine atom content rate was calculated by the following expression (1):

$$\text{Fluorine atom content rate(\% by mass)} = (Fn \times 19) \times 100 / Fw \quad (1)$$

Here, in the expression (1), Fn=Fn$^1$×(1−m)+Fn$^2$×m, wherein m represents the molar proportion of the formula (2), and Fn$^1$ and Fn$^2$ represent the numbers of fluorine atoms in the structural units represented by the formula (1) and the formula (2), respectively; Fw=Fw$^1$×(1−m)+Fw$^2$×m, wherein Fw$^1$ and Fw$^2$ represent the formula weights of the structural units represented by the formula (1) and the formula (2), respectively.

[Glass Transition Temperature]

A measurement sample was analyzed using DSC-50 manufactured by Shimadzu Corp., at 10° C./min as the heating rate of increase in temperature under a nitrogen atmosphere.

[Dynamic Mechanical Analysis]

A measurement sample was analyzed using RSA-III manufactured by TA Instruments in a tensile mode and under a nitrogen atmosphere, under the conditions of a rate of temperature increase of 3° C./min, an analysis frequency of 1 Hz, and a measureable distance of a sample deformation between chucks in dynamic mechanical analyzer was set in the range of 0 to 4.2 mm.

[Measurement of Scratch Hardness of Film According to Pencil Method]

A film obtained by spin coating on a glass substrate was used to measure the scratch hardness under a load of 100 g according to JIS K5600-5-4 (Pencil scratch test method).

[Observation of SEM Pattern]

The observation of the line-and-space and the cross-section of a imprint film product to which a fine pattern had been transcribed, and the measurement of film thickness were carried out by using a scanning electron microscope JSM-6701F manufactured by JASCO Corp. (hereinafter, indicated as SEM). The width of the lines and spaces was obtained by selecting arbitrary the pattern of three points from a cross-sectional photograph of SEM, measuring the lines and spaces with the measurement position set at one-half of the height, and calculating the average value.

[Mold Used in Imprint]

A silicon mold manufactured by Kyodo International, Inc. was used, and the mold dimensions were such that the width of a convex portion was designated as L1, the equal interval distance between two convexes as L2, and the height of the convex portion as L3. An area having a pattern in which the dimensions of a mold A were such that L1=420 nm, L2=570 nm, and L3=1600 nm, and the dimensions of a mold B were such that L1=200 nm, L2=100 nm, and L3=160 nm, was used in the evaluation of transferability.

[Thermal Imprint Apparatus]

An imprint by heat pressing method was carried out by using a nanoimprinter (NM-0501) manufactured by Meisyo Kiko Co., Ltd., by placing a film between a mold and a silicon wafer, with the patterned surface of the mold facing downward, and pressing the mold at predetermined temperature and pressure. Peeling of the film was carried out after cooling, and after removing the silicon wafer from the back surface of the film, by peeling from an edge of the film in a fixed direction.

[Solution Coating Imprint]

The coating of a polymer solution on the mold was carried out by a bar coater made of glass with a size of 8 mm (diameter)×100 mm (length). The mold was dried at room temperature for 30 minutes under a nitrogen gas stream, and then the mold was put in an inert oven set at a predetermined temperature, and was dried for a predetermined time period under a nitrogen gas stream. Peeling of the film to which a pattern had been transcribed, was carried out by pasting a Kapton tape at a film edge, and peeling the film in a fixed direction while using the tape as a support.

[UV Curing]

The curing of a UV-curable resin was carried out by irradiating blue light at 450 nm, using a LUXSPOT-II manufactured by JASCO Corp. as a light source.

Example 1

Synthesis of poly(1,1,2-trifluoro-2-trifluoromethyl-3,5-cyclopentylene ethylene)

A tetrahydrofuran solution of 5,5,6-trifluoro-6-(trifluoromethyl)bicyclo[2.2.1]hept-2-ene (100 g) and 1-hexene (268 mg) was mixed with a tetrahydrofuran solution of Mo(N-2,6-Pr$^i_2$C$_6$H$_3$)(CHCMe$_2$Ph)(OCMe(CF$_3$)$_2$)$_2$ (70 mg), and ring-opening metathesis polymerization was carried out at 70° C. The olefin moiety of the polymer thus obtained was subjected to a hydrogenation reaction using palladium alumina (5 g) at 160° C., and thus a tetrahydrofuran solution of poly(1,1,2-trifluoro-2-trifluoromethyl-3,5-cyclopentylene ethylene) was obtained.

The solution was added to methanol, and a white polymer was separated by filtration and was dried. Thus, 99 g of a polymer was obtained. The hydrogenation rate was 100%, the weight average molecular weight (Mw) was 127,000, the molecular weight distribution (Mw/Mn) was 1.70, and the glass transition temperature was 109° C. The fluorine atom content rate was 52.3% by mass.

Subsequently, a powder of the hydrogenated polymer thus obtained was treated by heat pressing, and thus a heat pressed sheet having a thickness of 0.37 mm was produced. From the results of the dynamic mechanical analysis by tensile mode carried out, it was found that a flat region of variation in storage modulus or loss modulus in the range of temperature which is not less than the glass transition temperature lies in the range of 113° C. to 152° C. or 117° C. to 152° C., the storage modulus was 5.81 MPa to 0.57 MPa or the loss modulus was 3.05 MPa to 0.27 MPa, the variation of the storage modulus with respect to temperature was −0.13 MPa/° C., and the variation of the loss modulus was −0.08 MPa/° C. The results of the dynamic mechanical analysis are shown in FIG. 1.

Example 2

Synthesis of poly(1,1,2-trifluoro-2-trifluoromethyl-3, 5-cyclopentylene ethylene)

The synthesis was carried out in the same manner as in Example 1, except that the catalyst was changed to Mo(N-2, 6-Pr$^i_2$C$_6$H$_3$)(CHCMe$_2$Ph)(OBu$^t$)$_2$ (50 mg), and thus poly(1, 1,2-trifluoro-2-trifluoromethyl-3,5-cyclopentylene ethylene) was obtained (98 g). The hydrogenation rate was 100%, the weight average molecular weight (Mw) was 83,000, the molecular weight distribution (Mw/Mn) was 1.73, and the glass transition temperature was 108° C. The fluorine atom content rate was 52.3% by mass.

Subsequently, a powder of the hydrogenated polymer thus obtained was treated by heat pressing, and thus a heat pressed sheet having a thickness of 0.37 mm was produced. From the results of the dynamic mechanical analysis by tensile mode carried out, it was found that a flat region of variation in storage modulus or loss modulus in the range of temperature which is not less than the glass transition temperature lies in the range of 109° C. to 150° C. or 113° C. to 150° C., the storage modulus was 4.98 MPa to 0.58 MPa or the loss modulus was 2.96 MPa to 0.31 MPa, the variation of the storage modulus with respect to temperature was −0.11 MPa/° C., and the variation of the loss modulus was −0.07 MPa/° C.

Example 3

Synthesis of poly(1,2-difluoro-1-trifluoromethyl-2-perfluoroethyl-3,5-cyclopentylene ethylene)

The synthesis was carried out in the same manner as in Example 1, except that the monomer was changed to 5,6-difluoro-5-trifluoromethyl-6-perfluoroethylbicyclo[2.2.1] hept-2-ene (50 g), and the catalyst was changed to Mo(N-2, 6-Pr$^i_2$C$_6$H$_3$)(CHCMe$_2$Ph)(OBu$^t$)$_2$ (17 mg), and thus poly(1, 2-difluoro-1-trifluoromethyl-2-perfluoroethyl-3,5-cyclopentylene ethylene) was obtained (49 g). The hydrogenation rate was 100%, the weight average molecular weight (Mw) was 95,000, the molecular weight distribution (Mw/Mn) was 1.52, and the glass transition temperature was 110° C. The fluorine atom content rate was 59.7% by mass.

Subsequently, a powder of the hydrogenated polymer thus obtained was treated by heat pressing, and thus a heat pressed sheet having a thickness of 0.37 mm was produced. From the results of the dynamic mechanical analysis by tensile mode carried out, it was found that a flat region of variation in storage modulus or loss modulus in the range of temperature which is not less than the glass transition temperature lies in the range of 115° C. to 160° C. or 119° C. to 160° C., the storage modulus was 5.01 MPa to 0.55 MPa or the loss modulus was 3.10 MPa to 0.24 MPa, the variation of the storage modulus with respect to temperature was −0.10 MPa/° C., and the variation of the loss modulus was −0.07 MPa/° C.

Example 4

Synthesis of poly(1,2-difluoro-1-heptafluoro-iso-propyl-2-trifluoromethyl-3,5-cyclopentylene ethylene)

A trifluoromethyltoluene solution of 5,6-difluoro-5-heptafluoro-iso-propyl-6-trifluoromethylbicyclo[2.2.1]hept-2-ene (50 g) and 1-hexene (0.034 g) was mixed with a trifluoromethyltoluene solution of Mo(N-2,6-Pr$^i_2$C$_6$H$_3$) (CHCMe$_2$Ph)(OBu$^t$)$_2$ (14 mg), and ring-opening metathesis polymerization was carried out at 70° C. The solvent of the polymer solution thus obtained was replaced with THF, and the olefin moiety was subjected to a hydrogenation reaction using palladium alumina (2.5 g) at 160° C. Thus, a THF solution of poly(1,2-difluoro-1-heptafluoroisopropyl-2-trifluoromethyl-3,5-cyclopentylene ethylene) was obtained. The solution was added to methanol, and a white polymer was separated by filtration and was dried. Thus, 49 g of a polymer was obtained. The hydrogenation rate was 100%, the weight average molecular weight (Mw) was 284,000, the molecular weight distribution (Mw/Mn) was 1.40, and the glass transition temperature was 137° C. The fluorine atom content rate was 61.9% by mass.

Subsequently, a powder of the hydrogenated polymer thus obtained was treated by heat pressing, and thus a heat pressed sheet having a thickness of 0.37 mm was produced. From the results of the dynamic mechanical analysis by tensile mode carried out, it was found that a flat region of variation in storage modulus or loss modulus in the range of temperature which is not less than the glass transition temperature lies in the range of 157° C. to 183° C. or 162° C. to 183° C., the storage modulus was 4.88 MPa to 0.49 MPa or the loss modulus was 4.30 MPa to 0.26 MPa, the variation of the storage modulus with respect to temperature was −0.17 MPa/° C., and the variation of the loss modulus was −0.19 MPa/° C.

Example 5

Production of Imprint Product According to Coating Method

Poly(1,1,2-trifluoro-2-trifluoromethyl-3,5-cyclopentylene ethylene) having a Mw of 127,000, synthesized in Example 1, was dissolved in cyclohexanone at a concentration of 20% by mass, and 20 mg of the solution thus prepared was dropped on the pattern of the mold A and was uniformly applied by bar coating.

Subsequently, the coated solution was dried at room temperature for 30 minutes under a nitrogen gas stream, and then was dried at 150° C. for 30 minutes. The mold was cooled to room temperature in a nitrogen atmosphere, and the film was peeled off from the mold. Thus, An imprint film product having a thickness of 7 μm and having a fine pattern transcribed thereon was obtained.

The pattern was observed with SEM, and as a result, the dimensions were such that L1=568 nm, L2=422 nm, and L3=1594 nm.

Example 6

An imprint film product having a thickness of 6 μm and having a fine pattern transcribed thereon was obtained by the same method as that described in Example 5, except that the drying temperature was changed to 180° C.

The pattern was observed with SEM, and as a result, the dimensions were such that L1=571 nm, L2=419 nm, and L3=1595 nm.

Example 7

An imprint film product was produced in the same manner as in Example 5, except that the mold A of Example 5 was changed to the mold B. The film thickness was 7 μm, and from the results of SEM observation of the pattern, the dimensions were such that L1=101 nm, L2=199 nm, and L3=161 nm.

Example 8

Poly(1,1,2-trifluoro-2-trifluoromethyl-3,5-cyclopentylene ethylene) having a Mw of 83,000, synthesized in Example 2, was dissolved in cyclohexanone at a concentration of 30% by mass, and 250 mg of the solution thus prepared was dropped on the pattern of the mold A and was uniformly applied by bar coating.

Subsequently, the coated solution was dried at room temperature for 30 minutes under a nitrogen gas stream, and then was dried at 180° C. for 90 minutes. The mold was cooled to room temperature in a nitrogen atmosphere, and the film was peeled off from the mold. Thus, an imprint film product having a thickness of 110 μm and having a fine pattern transcribed thereon was obtained.

The pattern was observed with SEM, and as a result, the dimensions were such that L1=569 nm, L2=421 nm, and L3=1592 nm.

Example 9

Poly(1,2-difluoro-1-trifluoromethyl-2-perfluoroethyl-3,5-cyclopentylene ethylene) synthesized in Example 3 was dissolved in butyl acetate at a concentration of 30% by mass, and 120 mg of the solution thus prepared was dropped on the pattern of the mold A and was uniformly applied by bar coating.

Subsequently, the coated solution was dried at room temperature for 30 minutes under a nitrogen gas stream, and then was dried at 180° C. for 60 minutes. The mold was cooled to room temperature in a nitrogen atmosphere, and the film was peeled off from the mold. Thus, an imprint film product having a thickness of 93 μm and having a fine pattern transcribed thereon was obtained.

The pattern was observed with SEM, and as a result, the dimensions were such that L1=569 nm, L2=421 nm, and L3=1595 nm.

Example 10

Poly(1,2-difluoro-1-heptafluoroisopropyl-2-trifluoromethyl-3,5-cyclopentylene ethylene) synthesized in Example 4 was dissolved in 1,3-bis(trifluoromethyl)benzene at a concentration of 20% by mass, and 150 mg of the solution thus prepared was dropped on the pattern of the mold A and was uniformly applied by bar coating.

Subsequently, the coated solution was dried at room temperature for 30 minutes under a nitrogen gas stream, and then was dried at 180° C. for 60 minutes. The mold was cooled to room temperature in a nitrogen atmosphere, and the film was peeled off from the mold. Thus, an imprint film product having a thickness of 87 μm and having a fine pattern transcribed thereon was obtained.

The pattern was observed with SEM, and as a result, the dimensions were such that L1=570 nm, L2=420 nm, and L3=1594 nm.

Example 11

Synthesis of poly(1,2-difluoro-1,2-bis(trifluoromethyl)-3,5-cyclopentylene ethylene) and production of imprint product according to coating method Poly(1,2-difluoro-1,2-bis(trifluoromethyl)-3,5-cyclopentylene ethylene) was obtained in the same manner as in Example 1 (49 g), except that the monomer was changed to 5,6-difluoro-5,6-bis(trifluoromethyl)bicyclo[2.2.1]hept-2-ene (50 g). The hydrogenation rate was 100%, the weight average molecular weight (Mw) was 188,000, the molecular weight distribution (Mw/Mn) was 1.50, and the glass transition temperature was 126° C. The fluorine atom content rate was 56.7% by mass.

Subsequently, a powder of the hydrogenated polymer thus obtained was treated by heat pressing, and thus a heat pressed sheet having a thickness of 0.37 mm was measured. From the results of the dynamic mechanical analysis by tensile mode carried out, it was found that a flat region of variation in storage modulus or loss modulus in the range of temperature which is not less than the glass transition temperature lies in the range of 131° C. to 172° C. or 135° C. to 172° C., the storage modulus was 4.99 MPa to 0.55 MPa or the loss modulus was 3.70 MPa to 0.33 MPa, the variation of the storage modulus with respect to temperature was −0.11 MPa/° C., and the variation of the loss modulus was −0.09 MPa/° C.

Subsequently, an imprint film product having a thickness of 10 μm and having a fine pattern transcribed thereon was obtained by the same method as that described in Example 5, except that the drying temperature was changed to 170° C.

The pattern was observed with SEM, and as a result, the dimensions were such that L1=572 nm, L2=418 nm, and L3=1594 nm.

Example 12

Synthesis of poly(1,1,2,2,3,3,3a,6a-octafluorocyclopentyl-3,5-cyclopentylene ethylene) and production of imprint product according to coating method Poly(1,1,2,2,3,3,3a,6a-octafluorocyclopentyl-3,5-cyclopentylene ethylene) was obtained in the same manner as in Example 1 (48 g), except that the monomer was changed to 2,3,3,4,4,5,5,6-octafluorotricyclo[5.2.1.0$^{2,6}$]dec-8-ene (50 g). The hydrogenation rate was 100%, the weight average molecular weight (Mw) was 126,000, the molecular weight distribution (Mw/Mn) was 1.49, and the glass transition temperature was 150° C. The fluorine atom content rate was 54.3% by mass.

Subsequently, a powder of the hydrogenated polymer thus obtained was treated by heat pressing, and thus a heat pressed sheet having a thickness of 0.37 mm was measured. From the results of the dynamic mechanical analysis by tensile mode carried out, it was found that flat region of variation in storage modulus or loss modulus in the range of temperature which is not less than the glass transition temperature lies in the range of 172° C. to 192° C. or 176° C. to 192° C., the storage modulus was 5.03 MPa to 0.48 MPa or the loss modulus was 3.90 MPa to 0.37 MPa, the variation of the storage modulus with respect to temperature was −0.23 MPa/° C., and the variation of the loss modulus was −0.22 MPa/° C.

Subsequently, an imprint film product having a thickness of 9 μm and having a fine pattern transcribed thereon was obtained by the same method as that described in Example 5, except that the drying temperature was changed to 190° C.

The pattern was observed with SEM, and as a result, the dimensions were such that L1=573 nm, L2=417 nm, and L3=1596 nm.

Example 13

Synthesis of poly(1-fluoro-1-perfluoroethyl-2,2-bis(trifluoromethyl)-3,5-cyclopentylene ethylene) and production of imprint product according to coating method Poly(1-fluoro-1-perfluoroethyl-2,2-bis(trifluoromethyl)-3,5-cyclopentylene ethylene) was obtained in the same manner as in Example 1 (48 g), except that the monomer was changed to 5-fluoro-5-perfluoroethyl-6,6-bis(trifluoromethyl)bicyclo[2.2.1]hept-2-ene (50 g). The hydrogenation rate was 100%, the weight average molecular weight (Mw) was 126,000, the molecular weight distribution (Mw/Mn) was 1.51, and the glass transition temperature was 142° C. The fluorine atom content rate was 61.9% by mass.

Subsequently, a powder of the hydrogenated polymer thus obtained was treated by heat pressing, and thus a heat pressed sheet having a thickness of 0.37 mm was measured. From the results of the dynamic mechanical analysis by tensile mode carried out, it was found that a flat region of variation in storage modulus or loss modulus in the range of temperature which is not less than the glass transition temperature lies in the range of 165° C. to 187° C. or 169° C. to 187° C., the storage modulus was 4.89 MPa to 0.58 MPa or the loss modulus was 4.50 MPa to 0.40 MPa, the variation of the storage modulus with respect to temperature was −0.20 MPa/° C., and the variation of the loss modulus was −0.23 MPa/° C.

Subsequently, an imprint film product having a thickness of 10 μm and having a fine pattern transcribed thereon was obtained by the same method as that described in Example 5, except that the drying temperature was changed to 180° C.

The pattern was observed with SEM, and as a result, the dimensions were such that L1=572 nm, L2=418 nm, and L3=1591 nm.

Example 14

Production of Imprint Product According to Heat Pressing Method

A cyclohexanone solution of poly(1,1,2-trifluoro-2-trifluoromethyl-3,5-cyclopentylene ethylene) produced in Example 1 was coated on a quartz glass substrate using an applicator. Subsequently, the coated substrate was heated for 30 minutes on a hot plate heated to 80° C. in air, and then was dried for 30 minutes at 230° C. under a nitrogen gas stream. The substrate was left to cool, and then the quartz glass was detached. Thus, a film having a size of 450 mm×550 mm (thickness=30 μm) was obtained.

Subsequently, the film thus obtained was heated to 160° C. and was brought into contact with the mold A. The film was pressed as heating at a pressure of 10 MPa and was maintained as such for 5 seconds. The film was cooled to 70° C., and then the mold was detached. Thus, an imprint film product having a thickness of 31 μm and having a fine pattern transcribed thereon was obtained.

The pattern was observed with SEM, and as a result, the dimensions were such that L1=581 nm, L2=409 nm, and L3=1601 nm.

Example 15

Poly(1,2-difluoro-1-heptafluoroisopropyl-2-trifluoromethyl-3,5-cyclopentylene ethylene) synthesized in Example 4 was pressed as heating, and thus a film having a size of 50 mm×50 mm (thickness=80 μm) was obtained.

Subsequently, the film thus obtained was heated to 180° C. and was brought into contact with the mold A. The film was pressed as heating at a pressure of 10 MPa and was maintained as such for 5 seconds. The film was cooled to 70° C., and then the mold was detached. Thus, an imprint film product having a thickness of 77 μm and having a fine pattern transcribed thereon was obtained.

The pattern was observed with SEM, and as a result, the dimensions were such that L1=583 nm, L2=407 nm, and L3=1604 nm.

Example 16

Production of Acrylic Curable Resin Imprint Product Using Replica Mold 50 mg of an acrylic UV-curable resin (Aronix (trade name), Toagosei Co., Ltd.) was uniformly applied on a quartz glass plate using a bar coater.

Subsequently, the film-like imprint product of poly(1,1,2-trifluoro-2-trifluoromethyl-3,5-cyclopentylene ethylene) produced in Example 5 as a replica mold was pressed on the coating liquid film to cover the patterned surface, and the system was irradiated with UV at room temperature for 15 minutes from the back surface of the replica mold (amount of irradiated radiation: 34 mJ/cm$^2$). After the irradiation, the film was peeled off from the mold, and an imprint film product having a thickness of 100 μm and having a fine pattern transcribed thereon was obtained.

The pattern was observed with SEM, and as a result, the dimensions were such that L1=421 nm, L2=569 nm, and L3=1595 nm.

Example 17

Production of Epoxy-Based Curable Resin Imprint Product Using Replica Mold 53 mg of an epoxy-based curable resin (a mixture of 40% by mass of 4,4'-bis(7-oxabicyclo[4.1.0]heptan-3-yl), 50% by mass of 3-ethyl-3-(phenoxymethyl)oxetane, and 10% by mass of 1,4-bis[((3-ethyloxetan-3-yl)methoxy)methyl]benzene), with a sulfonium salt as an initiator, was applied uniformly on a quartz glass plate using a bar coater.

Subsequently, the film-like imprint product of poly(1,1,2-trifluoro-2-trifluoromethyl-3,5-cyclopentylene ethylene)

produced in Example 6 as a replica mold was pressed on the coating liquid film to cover the patterned surface of that mold, and the system was irradiated with UV at room temperature for 15 minutes from the back surface of the replica mold (amount of irradiated radiation: 34 mJ/cm$^2$). After the irradiation, the film was peeled off from the mold, and an imprint film product having a thickness of 95 μm and having a fine pattern transcribed thereon was obtained.

The pattern was observed with SEM, and as a result, the dimensions were such that L1=420 nm, L2=570 nm, and L3=1596 nm.

Comparative Example 1

Synthesis of poly(1-trifluoromethyl-3,5-cyclopentylene ethylene) and production of imprint product according to coating method Poly(1-trifluoromethyl-3,5-cyclopentylene ethylene) was obtained in the same manner as in Example 1 (9 g), except that the monomer was changed to 5-(trifluoromethyl)bicyclo[2.2.1]hept-2-ene (10 g). The hydrogenation rate was 100%, the weight average molecular weight (Mw) was 98,000, the molecular weight distribution (Mw/Mn) was 1.17, and the glass transition temperature was 47° C. The fluorine atom content rate was 34.7% by mass.

From the results of the dynamic mechanical analysis by tensile mode, which was carried out using a heat pressed sheet having a thickness of 0.37 mm, a flat variation region of storage modulus or loss modulus in the region of temperature which is not less than the glass transition temperature was not observed. The storage modulus in the range 48° C. to 57° C. was 92.3 MPa to 0.11 MPa, the loss modulus in the same temperature range was 97.1 MPa to 0.13 MPa, the variation of the storage modulus with respect to temperature was −10.2 MPa/° C., and the variation of the loss modulus was −10.8 MPa/° C.

Subsequently, poly(1-trifluoromethyl-3,5-cyclopentylene ethylene) thus obtained was dissolved in cyclohexanone at a concentration of 20% by mass, and 23 mg of the solution thus prepared was dropped on the pattern of the mold A and was uniformly applied by bar coating. The coated solution was dried at room temperature for 30 minutes under a nitrogen gas stream, and then was dried at 150° C. for 30 minutes. The mold was cooled to 5° C. in a nitrogen atmosphere, and the film was peeled off from the mold. Thus, an imprint film product having a thickness of 7 μm and having a fine pattern transcribed thereon was obtained.

The pattern was observed with SEM, and as a result, the pattern had a shape of disarrayed lines, with L1=569 nm to 598 nm.

Comparative Example 2

Synthesis of poly(3,4-bis(trifluoromethyl)-2,5-(1-oxacyclopentylene)ethylene) and production of imprint product according to coating method Poly(3,4-bis(trifluoromethyl)-2,5-(1-oxacyclopentylene)ethylene) was obtained in the same manner as in Example 1 (9 g), except that the monomer was changed to 2,3-bis(trifluoromethyl)-7-oxabicyclo[2.2.1]hept-2-ene (10 g). The hydrogenation rate was 100%, the weight average molecular weight (Mw) was 90,000, the molecular weight distribution (Mw/Mn) was 1.41, and the glass transition temperature was 44° C.

From the results of the dynamic mechanical analysis by tensile mode, which was carried out using a heat pressed sheet having a thickness of 0.37 mm, a flat variation region of storage modulus or loss modulus in the region of temperature which is not less than the glass transition temperature was not observed. The storage modulus in the range 45° C. to 55° C. was 99.3 MPa to 0.12 MPa, the loss modulus in the same temperature range was 103.2 MPa to 0.11 MPa, the variation of the storage modulus with respect to temperature was −9.9 MPa/° C., and the variation of the loss modulus was −10.3 MPa/° C.

Subsequently, poly(3,4-bis(trifluoromethyl)-2,5-(1-oxacyclopentylene)ethylene) thus obtained was dissolved in cyclohexanone at a concentration of 20% by mass, and 24 mg of the solution thus prepared was dropped on the pattern of the mold A and was uniformly applied by bar coating. The coated solution was dried at room temperature for 30 minutes under a nitrogen gas stream, and then was dried at 150° C. for 30 minutes. The mold was cooled to 5° C. in a nitrogen atmosphere, and the film was peeled off from the mold. Thus, an imprint film product having a thickness of 8 μm and having a fine pattern transcribed thereon was obtained.

The pattern was observed with SEM, and as a result, the pattern had a shape of disarrayed lines, with L1=571 nm to 601 nm.

Comparative Example 3

Synthesis of poly(1-methyl-3,5-cyclopentylene ethylene) and production of imprint product according to coating method Poly(1-methyl-3,5-cyclopentylene ethylene) was obtained in the same manner as in Example 1 (9 g), except that the monomer was changed to 5-methylbicyclo[2.2.1]hept-2-ene (10 g). The hydrogenation rate was 100%, the weight average molecular weight (Mw) was 182,000, the molecular weight distribution (Mw/Mn) was 1.11, and the glass transition temperature was 34° C.

From the results of the dynamic mechanical analysis by tensile mode, which was carried out using a heat pressed sheet having a thickness of 0.37 mm, a flat variation region of storage modulus or loss modulus in the region of temperature which is not less than the glass transition temperature was not observed. The storage modulus in the range 38° C. to 49° C. was 101.1 MPa to 0.11 MPa, the loss modulus in the above region range 38° C. to 49° C. was 94.8 MPa to 0.12 MPa, the variation of the storage modulus with respect to temperature was −9.2 MPa/° C., and the variation of the loss modulus was −8.6 MPa/° C.

Subsequently, poly(1-methyl-3,5-cyclopentylene ethylene) thus obtained was dissolved in cyclohexanone at a concentration of 20% by mass, and 27 mg of the solution thus prepared was dropped on the pattern of the mold A and was uniformly applied by bar coating. The coated solution was dried at room temperature for 30 minutes under a nitrogen gas stream, and then was dried at 150° C. for 30 minutes. The mold was cooled to 5° C. in a nitrogen atmosphere. Attempts were made to peel off the film from the mold, but no film was obtained.

Comparative Example 4

Production of Imprint Product by Teflon (Registered Trademark) AF1600 According to Coating Method 25 mg of a perfluoro-2-n-butyl-tetrahydrofuran (Fluorinert (registered trademark) FC75) solution containing 20% by mass of Teflon (registered trademark) AF1600 (Aldrich product, glass transition temperature=162° C.), which is a copolymer of tetrafluoroethylene and 4,5-difluoro-2,2-bis(trifluoromethyl)-1,3-dioxazole, was applied on the pattern-formed surfaces of the mold A and the mold B using a bar coater. However, coating films could not be formed because the applied liquid repelled on the mold surface.

Comparative Example 5

Production of Imprint Product by Teflon (Registered Trademark) AF1600 According to Heat Pressing Method A powder of Teflon (registered trademark) AF1600 of Comparative Example 4 was pressed as heating at 260° C., and thus a film having a size of 50 mm×50 mm (thickness=90 µm) was obtained.

Subsequently, the film thus obtained was heated to 200° C. and was brought into contact with the mold A. The film was pressed as heating at a pressure of 10 MPa and was maintained as such for 5 seconds. The film was cooled to 70° C., and then the mold was detached. Thus, a film having a thickness of 85 µm and having a fine pattern transcribed thereon was obtained.

The pattern was observed with SEM, and areas in which the convex was smashed and transfer was not achieved, and areas having a shape of disarrayed lines with L1=510 nm to 650 nm, were observed. Thus, it was not possible to obtain an imprint product.

Example 18

Synthesis of copolymer of poly(1,1,2-trifluoro-2-trifluoromethyl-3,5-cyclopentylene ethylene) and poly(3,3,4-trifluoro-4-trifluoromethyl-7,9-tricyclo[4.3.0.1$^{2,5}$]decanylene ethylene)

A tetrahydrofuran solution of 5,5,6-trifluoro-6-(trifluoromethyl)bicyclo[2.2.1]hept-2-ene (50 g), 8,8,9-trifluoro-9-(trifluoromethyl)-tetracyclo[4.4.0.1$^{2,5}$.1$^{7,10}$]-3-dodecene (22 g), and 1-hexene (0.462 g) was mixed with a tetrahydrofuran solution of Mo(N-2,6-Pr$^i_2$C$_6$H$_3$)(CHCMe$_2$Ph)(OBu$^t$)$_2$ (33.9 mg), and ring-opening metathesis polymerization was carried out at 70° C. The olefin moiety of the polymer thus obtained was subjected to a hydrogenation reaction using palladium alumina (3.6 g) at 160° C., and thus a tetrahydrofuran solution of a copolymer of poly(1,1,2-trifluoro-2-trifluoromethyl-3,5-cyclopentylene ethylene) and poly(3,3,4-trifluoro-4-trifluoromethyl-7,9-tricyclo[4.3.0.1$^{2,5}$]decanylene ethylene) was obtained. The solution was added to methanol, and a white polymer was separated by filtration and was dried. Thus, 71 g of a polymer was obtained. The hydrogenation rate was 100%, the weight average molecular weight (Mw) was 98,000, the molecular weight distribution (Mw/Mn) was 2.51, and the glass transition temperature was 129° C. The composition ratio [A]/[B] was 75/25, and the fluorine atom content rate was 49.2% by mass.

Subsequently, a powder of the hydrogenated polymer thus obtained was treated by heat pressing, and thus a heat pressed sheet having a thickness of 0.37 mm was produced. From the results of the dynamic mechanical analysis by tensile mode carried out, it was found that a flat region of variation in storage modulus or loss modulus in the range of temperature which is not less than the glass transition temperature lies in the range of 149° C. to 163° C. or 153° C. to 163° C., the storage modulus was 1.21 MPa to 0.26 MPa or the loss modulus was 0.62 MPa to 0.18 MPa, the variation of the storage modulus with respect to temperature was −0.07 MPa/° C., and the variation of the loss modulus was −0.04 MPa/° C.

Example 19

Synthesis of copolymer of poly(1,1,2-trifluoro-2-trifluoromethyl-3,5-cyclopentylene ethylene) and poly(3,3,4-trifluoro-4-trifluoromethyl-7,9-tricyclo[4.3.0.1$^{2,5}$]decanylene ethylene)

A copolymer of poly(1,1,2-trifluoro-2-trifluoromethyl-3,5-cyclopentylene ethylene) and poly(3,3,4-trifluoro-4-trifluoromethyl-7,9-tricyclo[4.3.0.1$^{2,5}$]decanylene ethylene) (62 g) was obtained in the same manner as in Example 18, except that the injection molar ratio of 5,5,6-trifluoro-6-(trifluoromethyl)bicyclo[2.2.1]hept-2-ene and 8,8,9-trifluoro-9-(trifluoromethyl)-tetracyclo[4.4.0.1$^{2,5}$.1$^{7,10}$]-3-dodecene monomers was changed to 25/75. The hydrogenation rate was 100%, the weight average molecular weight (Mw) was 112,000, the molecular weight distribution (Mw/Mn) was 2.51, and the glass transition temperature was 175° C. The composition ratio [A]/[B] was 25/75, and the fluorine atom content rate was 42.9% by mass.

Subsequently, a powder of the hydrogenated polymer thus obtained was treated by heat pressing, and thus a heat pressed sheet having a thickness of 0.37 mm was produced. From the results of the dynamic mechanical analysis by tensile mode carried out, it was found that a flat region of variation in storage modulus or loss modulus in the range of temperature which is not less than the glass transition temperature lies in the range of 195° C. to 209° C. or 199° C. to 209° C., the storage modulus was 1.19 MPa to 0.24 MPa or the loss modulus was 0.60 MPa to 0.16 MPa, the variation of the storage modulus with respect to temperature was −0.07 MPa/° C., and the variation of the loss modulus was −0.044 MPa/° C.

Example 20

Synthesis of copolymer of poly(1,2-difluoro-1,2-bis(trifluoromethyl)-3,5-cyclopentylene ethylene) and poly(3,3,4-trifluoro-4-trifluoromethyl-7,9-tricyclo[4.3.0.1$^{2,5}$]decanylene ethylene)

A tetrahydrofuran solution of 5,6-difluoro-5,6-bis(trifluoromethyl)bicyclo[2.2.1]hept-2-ene (50 g), 8,8,9-trifluoro-9-(trifluoromethyl)-tetracyclo[4.4.0.1$^{2,5}$.1$^{7,10}$]-3-dodecene (54 g), and 1-hexene (0.462 g) was mixed with a tetrahydrofuran solution of Mo(N-2,6-Pr$^i_2$C$_6$H$_3$)(CHCMe$_2$Ph)(OBu$^t$)$_2$ (41.3 mg), and ring-opening metathesis polymerization was carried out at 70° C. The olefin moiety of the polymer thus obtained was subjected to a hydrogenation reaction using palladium alumina (5.0 g) at 160° C., and thus a tetrahydrofuran solution of a copolymer of poly(1,2-difluoro-1,2-bis(trifluoromethyl)-3,5-cyclopentylene ethylene) and poly(3,3,4-trifluoro-4-trifluoromethyl-7,9-tricyclo[4.3.0.1$^{2,5}$]decanylene ethylene) was obtained. The solution was added to methanol, and a white polymer was separated by filtration and was dried. Thus, 101 g of a polymer was obtained. The hydrogenation rate was 100%, the weight average molecular weight (Mw) was 106,000, the molecular weight distribution (Mw/Mn) was 2.54, and the glass transition temperature was 158° C. The composition ratio [A]/[B] was 50/50, and the fluorine atom content rate was 48.4% by mass.

Subsequently, a powder of the hydrogenated polymer thus obtained was treated by heat pressing, and thus a heat pressed sheet having a thickness of 0.36 mm was produced. From the results of the dynamic mechanical analysis by tensile mode carried out, it was found that a flat region of variation in storage modulus or loss modulus in the range of temperature which is not less than the glass transition temperature lies in the range of 178° C. to 192° C. or 182° C. to 192° C., the storage modulus was 1.20 MPa to 0.24 MPa or the loss modulus was 0.63 MPa to 0.19 MPa, the variation of the storage modulus with respect to temperature was −0.07 MPa/° C., and the variation of the loss modulus was −0.04 MPa/° C.

Example 21

Synthesis of poly(1,1,2-trifluoro-2-trifluoromethoxy-3,5-cyclopentylene ethylene)

A tetrahydrofuran solution of 5,5,6-trifluoro-6-(trifluoromethoxy)bicyclo[2.2.1]hept-2-ene (50 g) and 1-hexene (134 mg) was mixed with a tetrahydrofuran solution of $Mo(N-2,6-Pr^i_2C_6H_3)(CHCMe_2Ph)(OCMe(CF_3)_2)_2$ (35 mg), and ring-opening metathesis polymerization was carried out at 70° C. The olefin moiety of the polymer thus obtained was subjected to a hydrogenation reaction using palladium alumina (2.5 g) at 160° C., and thus a tetrahydrofuran solution of poly(1,1,2-trifluoro-2-trifluoromethoxy-3,5-cyclopentylene ethylene) was obtained. The solution was added to methanol, and a white polymer was separated by filtration and was dried. Thus, 48 g of a polymer was obtained. The hydrogenation rate was 100%, the weight average molecular weight (Mw) was 131,000, the molecular weight distribution (Mw/Mn) was 1.73, and the glass transition temperature was 101° C. The fluorine atom content rate was 48.7% by mass.

Subsequently, a powder of the hydrogenated polymer thus obtained was treated by heat pressing, and thus a heat pressed sheet having a thickness of 0.37 mm was produced. From the results of the dynamic mechanical analysis by tensile mode carried out, it was found that a flat region of variation in storage modulus or loss modulus in the range of temperature which is not less than the glass transition temperature lies in the range of 104° C. to 143° C. or 108° C. to 141° C., the storage modulus was 5.79 MPa to 0.52 MPa or the loss modulus was 3.01 MPa to 0.24 MPa, the variation of the storage modulus with respect to temperature was −0.14 MPa/° C., and the variation of the loss modulus was −0.08 MPa/° C.

Example 22

30 mg of a solution prepared by dissolving the copolymer of poly(1,1,2-trifluoro-2-trifluoromethyl-3,5-cyclopentylene ethylene) and poly(3,3,4-trifluoro-4-trifluoromethyl-7,9-tricyclo[4.3.0.1$^{2,5}$]decanylene ethylene) (composition ratio [A]/[B]=75/25) having a Mw of 98,000, synthesized in Example 18, in cyclohexanone at a concentration of 20% by mass, was dropped on the pattern of the mold A, and was uniformly applied by bar coating. Subsequently, the coated solution was dried at room temperature for 30 minutes under a nitrogen gas stream, and then was dried at 180° C. for 60 minutes. The mold was cooled to room temperature in a nitrogen atmosphere, and the film was peeled off from the mold. Thus, an imprint film product having a thickness of 8 μm and having a fine pattern transcribed thereon was obtained.

The pattern was observed with SEM, and as a result, the dimensions were such that L1=570 nm, L2=420 nm, and L3=1595 nm.

Example 23

30 mg of a solution prepared by dissolving the copolymer of poly(1,1,2-trifluoro-2-trifluoromethyl-3,5-cyclopentylene ethylene) and poly(3,3,4-trifluoro-4-trifluoromethyl-7,9-tricyclo[4.3.0.1$^{2,5}$]decanylene ethylene) (composition ratio [A]/[B]=25/75) having a Mw of 112,000, synthesized in Example 19, in cyclohexanone at a concentration of 20% by mass, was dropped on the pattern of the mold A, and was uniformly applied by bar coating. Subsequently, the coated solution was dried at room temperature for 30 minutes under a nitrogen gas stream, and then was dried at 200° C. for 60 minutes. The mold was cooled to room temperature in a nitrogen atmosphere, and the film was peeled off from the mold. Thus, an imprint film product having a thickness of 8 μm and having a fine pattern transcribed thereon was obtained.

The pattern was observed with SEM, and as a result, the dimensions were such that L1=571 nm, L2=419 nm, and L3=1594 nm.

Example 24

30 mg of a solution prepared by dissolving the copolymer of poly(1,2-difluoro-1,2-bis(trifluoromethyl)-3,5-cyclopentylene ethylene) and poly(3,3,4-trifluoro-4-trifluoromethyl-7,9-tricyclo[4.3.0.1$^{2,5}$]decanylene ethylene) (composition ratio [A]/[B]=50/50) having a Mw of 106,000, synthesized in Example 20, in cyclohexanone at a concentration of 20% by mass, was dropped on the pattern of the mold A, and was uniformly applied by bar coating. Subsequently, the coated solution was dried at room temperature for 30 minutes under a nitrogen gas stream, and then was dried at 190° C. for 60 minutes. The mold was cooled to room temperature in a nitrogen atmosphere, and the film was peeled off from the mold. Thus, an imprint film product having a thickness of 9 μm and having a fine pattern transcribed thereon was obtained.

The pattern was observed with SEM, and as a result, the dimensions were such that L1=571 nm, L2=419 nm, and L3=1595 nm.

Example 25

30 mg of a solution prepared by dissolving poly(1,1,2-trifluoro-2-trifluoromethoxy-3,5-cyclopentylene ethylene) having a Mw of 131,000, synthesized in Example 21, in cyclohexanone at a concentration of 20% by mass, was dropped on the pattern of the mold A, and was uniformly applied by bar coating. Subsequently, the coated solution was dried at room temperature for 30 minutes under a nitrogen gas stream, and then was dried at 200° C. for 60 minutes. The mold was cooled to room temperature in a nitrogen atmosphere, and the film was peeled off from the mold. Thus, an imprint film product having a thickness of 8 μm and having a fine pattern transcribed thereon was obtained.

The pattern was observed with SEM, and as a result, the dimensions were such that L1=571 nm, L2=419 nm, and L3=1594 nm.

Example 26

Measurement of Scratch Hardness of Film According to Pencil Method

A solution prepared by dissolving poly(1,1,2-trifluoro-2-trifluoromethyl-3,5-cyclopentylene ethylene) (composition ratio [A]/[B]=100/0) having a Mw of 127,000, synthesized in Example 1, in cyclohexanone at a concentration of 20% by mass, was dropped on a glass substrate, and was uniformly applied by spin coating. Subsequently, the coated solution was dried at 180° C. for 60 minutes under a nitrogen gas stream, and was left to cool at room temperature in air. Thus, a film having a thickness of 15 μm and coated on the glass substrate was obtained. The scratch hardness under a load of 100 g was 4B.

A film having a thickness of 15 μm and coated on the glass substrate was obtained by the same method as described above, except that the polymer was changed to the copolymers synthesized in Example 18 (Mw 98,000, composition ratio [A]/[B]=75/25) and in Example 19 (Mw 112,000, composition ratio [A]/[B]=25/75). The results obtained by measuring the scratch hardness were 3B for the polymer of Example 18, and 2B for the polymer of Example 19. Thus, the scratch hardness was enhanced in both of the polymers, as compared with the polymer of Example 1.

Comparative Example 6

Synthesis of copolymer of poly(1,2-difluoro-1,2-bis (trifluoromethyl)-3,5-cyclopentylene ethylene) and poly(3-trifluoromethyl-7,9-tricyclo[4.3.0.1$^{2,5}$] decanylene ethylene) having composition ratio of [A]/[B]=10/90, and production of imprint product according to coating method A tetrahydrofuran solution of 5,6-difluoro-5,6-bis(trifluoromethyl)bicyclo[2.2.1]hept-2-ene (5 g) and 8-trifluoromethyl-tetracyclo[4.4.0.1$^{2,5}$.1$^{7,10}$]-3-dodecene (39 g) and 1-hexene (0.418 g) was mixed with a tetrahydrofuran solution of Mo(N-2,6-Pr$^{i}_{2}$C$_{6}$H$_{3}$)(CHCMe$_{2}$Ph)(OBu$^{t}$)$_{2}$ (20 mg), and ring-opening metathesis polymerization was carried out at 70° C. The olefin moiety of the obtained polymer was subjected to a hydrogenation reaction using palladium alumina (2.2 g) at 160° C., and a tetrahydrofuran solution of the copolymer of poly(1,2-difluoro-1,2-bis(trifluoromethyl)-3, 5-cyclopentylene ethylene) and poly(3-trifluoromethyl-7,9-tricyclo[4.3.0.1$^{2,5}$]decanylene ethylene) was obtained. The solution was added to methanol, and a white polymer was separated by filtration and was dried. Thus, 42 g of a polymer was obtained. The hydrogenation rate was 100%, the weight average molecular weight (Mw) was 94,000, the molecular weight distribution (Mw/Mn) was 2.57, and the glass transition temperature was 176° C. The composition ratio [A]/[B] was 10/90, and the fluorine atom content rate was 27.9% by mass.

Subsequently, a powder of the hydrogenated polymer thus obtained was treated by heat pressing, and thus a heat pressed sheet having a thickness of 0.36 mm was produced. From the results of the dynamic mechanical analysis by tensile mode carried out, a flat variation region of storage modulus or loss modulus in the region of temperature which is not less than the glass transition temperature was not observed.

30 mg of a solution prepared by dissolving the copolymer of poly(1,2-difluoro-1,2-bis(trifluoromethyl)-3,5-cyclopentylene ethylene) and poly(3-trifluoromethyl-7,9-tricyclo [4.3.0.1$^{2,5}$]decanylene ethylene) (composition ratio [A]/ [B]=10/90) thus obtained, in cyclohexanone at a concentration of 20% by mass, was dropped on the pattern of the mold A, and was uniformly applied by bar coating. The coated solution was dried at room temperature for 30 minutes under a nitrogen gas stream, and then was dried at 200° C. for 60 minutes. The mold was cooled to room temperature in a nitrogen atmosphere, and the film was peeled off from the mold. When the transfer surface of the film was observed by SEM, the pattern was disarrayed, and it was not possible to obtain a satisfactory imprint product.

The present invention may adopt the following embodiments.

(a) An imprint product having a fine pattern on the surface, which is obtained by transcribing a fine pattern on the surface of a mold to a fluorine-containing cyclic olefin polymer containing a repeating structural unit represented by formula (1) and having a fluorine atom content rate of 40% to 75% by mass:

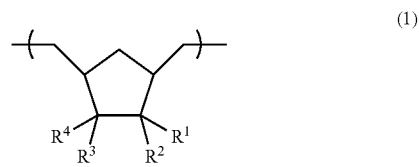

(1)

wherein in the formula (1), at least one of R$^{1}$ to R$^{4}$ represents fluorine, or a fluorine-containing C1-C10 alkyl; the others of R$^{1}$ to R$^{4}$ that do not contain fluorine are each selected from hydrogen and a C1-C10 alkyl; and R$^{1}$ to R$^{4}$ may be joined together to form a cyclic structure.

(b) The imprint product as set forth in (a), wherein the fluorine-containing cyclic olefin polymer has a region in which the storage modulus or loss modulus varies in the range of −1 MPa/° C. to 0 MPa/° C. with respect to the temperature change over a region of temperature which is not less than the glass transition temperature.

(c) The imprint product as set forth in the (b), wherein the flat region of variation of the storage modulus or loss modulus of the fluorine-containing cyclic olefin polymer over the region of temperature which is not less than the glass transition temperature, lies in a storage modulus region or loss modulus region of 0.1 MPa or more.

(d) A method for producing the imprint product as set forth in any one of (a) to (c), the method including bringing a solution formed from the fluorine-containing cyclic olefin polymer and an organic solvent into contact with a mold having a fine pattern formed on the surface, evaporating the solvent, and thereby transcribing the pattern of the mold.

(e) A method for producing the imprint product as set forth in any one of (a) to (c), the method including pressing a mold having a fine pattern on the surface of a film containing the fluorine-containing cyclic olefin polymer, and thereby transcribing the pattern of the mold.

(f) A method for producing a cured product, the method including bringing the surface having a fine pattern of the imprint product as set forth in any one of (a) to (e), into contact with a photocurable monomer composition; curing the photocurable monomer composition by light irradiation, detaching the imprint product, and thereby obtaining a fine pattern transcribed to the surface of a photocured resin.

INDUSTRIAL APPLICABILITY

The fluorine-containing cyclic olefin polymer of the present invention having a specific structure is useful as an imprint product itself used in a nanoimprint method, or as a replica mold, and is industrially highly valuable. The imprint product or cured product having a fine pattern, which is obtained by using the production method of the present invention, is useful as an optical element (such as a micro lens array, an optical waveguide, an optical switch, a Fresnel zone plate, a binary optical element, a blaze optical element, a photonic crystal), an antireflection filter, a biochip, a micro reactor chip, a recording medium, a display material, a catalyst support, or the like.

The invention claimed is:

1. An imprint product on which a fine pattern of a mold surface is transcribed, wherein the imprint product is comprised of a fluorine-containing cyclic olefin polymer comprising a repeating structural unit [A] represented by formula (1) and a repeating structural unit [B] represented by formula (2), with the molar ratio of the structural units being [A]/[B]=95/5 to 25/75, and said fluorine-containing cyclic olefin polymer having a fluorine atom content rate of 40% to 75% by mass:

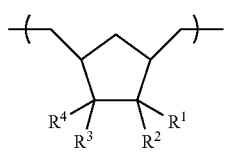

(1)

wherein in the formula (1), at least one of $R^1$ to $R^4$ represents fluorine, a fluorine-containing C1-C10 alkyl, a fluorine-containing C1-C10 alkoxy, or a fluorine-containing C2-C10 alkoxyalkyl; when $R^1$ to $R^4$ represent groups containing no fluorine, $R^1$ to $R^4$ are each selected from hydrogen, a C1-C10 alkyl, a C1-C10 alkoxy, and a C2-C10 alkoxyalkyl; each of $R^1$ to $R^4$ are identical or are different from the others; and $R^1$ to $R^4$ are optionally joined together to form a cyclic structure:

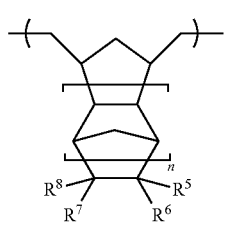

(2)

wherein in the formula (2), at least one of $R^5$ to $R^8$ represents fluorine, a fluorine-containing C1-C10 alkyl, a fluorine-containing C1-C10 alkoxy, or a fluorine-containing C2-C10 alkoxyalkyl; when $R^5$ to $R^8$ represent groups containing no fluorine, $R^5$ to $R^8$ are each selected from hydrogen, a C1-C10 alkyl, a C1-C10 alkoxy, and a C2-C10 alkoxyalkyl; each of $R^5$ to $R^8$ are identical with or are different from the others; $R^5$ to $R^8$ are optionally joined together to form a cyclic structure; and n represents an integer of 1 or 2.

2. The imprint product as set forth in claim 1, wherein said fluorine-containing cyclic olefin polymer has a variation in the storage modulus or loss modulus thereof obtained by dynamic mechanical analysis by tensile mode at a frequency of 1 Hz and a rate of temperature increase of 3° C./min, which lies in a region of −1 MPa/° C. to 0 MPa/° C. to the changes in temperature in a range of temperature which is not less than the glass transition temperature.

3. The imprint product as set forth in claim 2, wherein the region of variation in the storage modulus or loss modulus of said fluorine-containing cyclic olefin polymer in the range of temperature which is not less than the glass transition temperature, lies in a storage modulus region or loss modulus region of 0.1 MPa or more.

4. A method for producing the imprint product using a fluorine-containing cyclic olefin polymer as set forth in claim 1, comprising:
bringing a solution containing said fluorine-containing cyclic olefin polymer and an organic solvent into contact with a mold having a fine pattern on the surface and evaporating the solvent to transcribe the pattern of the mold.

5. A method for producing the imprint product on which a fine pattern of a mold surface is transcribed as set forth in claim 1, comprising:
applying a solution containing said fluorine-containing cyclic olefin polymer and an organic solvent on the surface of a mold having a fine pattern, and
evaporating the solvent from said solution.

6. A method for producing the imprint product on which a fine pattern of a mold surface is transcribed as set forth in claim 1, comprising:
pressing the surface of a film containing said fluorine-containing cyclic olefin polymer with the surface of a mold having a fine pattern.

* * * * *